(12) United States Patent
Lee et al.

(10) Patent No.: US 7,396,765 B2
(45) Date of Patent: Jul. 8, 2008

(54) METHOD OF FABRICATING A LIQUID CRYSTAL DISPLAY DEVICE

(75) Inventors: Dai Yun Lee, Uiwang-si (KR); Yong In Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/254,764

(22) Filed: Oct. 21, 2005

(65) Prior Publication Data

US 2006/0105486 A1    May 18, 2006

(30) Foreign Application Priority Data

Nov. 12, 2004  (KR) ...................... 10-2004-0092683

(51) Int. Cl.
*H01L 21/44* (2006.01)

(52) U.S. Cl. ...................... 438/673; 438/713; 438/733; 438/738; 257/401; 257/412; 257/915; 257/E21.413; 257/E21.582; 257/E29.137; 257/E29.151; 257/E29.278

(58) Field of Classification Search ................. 438/592, 438/595, 673, 713, 733, 738, 584, 597, 669, 438/672; 257/401, 412, 915, E21.413, E21.582, 257/E29.137, E29.151, E29.278
See application file for complete search history.

(56) References Cited

U.S. PATENT DOCUMENTS

| | | | | |
|---|---|---|---|---|
| 6,048,783 | A * | 4/2000 | Kim et al. ................... | 438/588 |
| 6,069,387 | A * | 5/2000 | Gardner ...................... | 257/344 |
| 6,091,120 | A * | 7/2000 | Yeom et al. .................. | 257/401 |
| 6,403,409 | B1 | 6/2002 | You | |
| 6,617,203 | B2 | 9/2003 | Kim et al. | |
| 6,753,235 | B2 | 6/2004 | So et al. | |
| 6,773,944 | B2 * | 8/2004 | Okamoto ..................... | 438/30 |
| 6,933,989 | B2 * | 8/2005 | Oke et al. .................... | 349/43 |
| 2001/0003657 | A1 | 6/2001 | Lee | |
| 2004/0087125 | A1 * | 5/2004 | Monoe ........................ | 438/592 |
| 2005/0101044 | A1 | 5/2005 | Cho et al. | |
| 2005/0186698 | A1 * | 8/2005 | Ishida et al. .................. | 438/99 |
| 2005/0285194 | A1 | 12/2005 | Lee et al. | |
| 2006/0017054 | A1 | 1/2006 | Ahn | |

FOREIGN PATENT DOCUMENTS

| | | |
|---|---|---|
| KR | 10-19970008589 | 5/1997 |
| KR | 10-19970011966 | 8/1997 |
| KR | 10-0161461 | 8/1998 |
| KR | 10-0175408 | 11/1998 |
| KR | 10-0177785 | 11/1998 |
| KR | 10-0184509 | 12/1998 |
| KR | 10-0192593 | 1/1999 |

(Continued)

*Primary Examiner*—W. David Coleman
*Assistant Examiner*—Su C Kim
(74) *Attorney, Agent, or Firm*—McKenna, Long & Aldridge LLP

(57) ABSTRACT

A method of fabricating a liquid crystal display device according to an embodiment of the present invention includes forming first and second conductive layers on a substrate, wherein the first layer is transparent; patterning the second conductive layer and the first conductive layer using the photo-resist pattern as a mask; etching at least one lateral part of the patterned second conductive layer using the photo-resist pattern as a mask; and removing the remaining photo-resist pattern.

3 Claims, 34 Drawing Sheets

FOREIGN PATENT DOCUMENTS

| | | |
|---|---|---|
| KR | 10-20000025565 | 5/2000 |
| KR | 10-20000026894 | 5/2000 |
| KR | 10-20000026895 | 5/2000 |
| KR | 10-20000031451 | 6/2000 |
| KR | 10-20000041223 | 7/2000 |
| KR | 10-20000075031 | 12/2000 |
| KR | 10-20010019665 | 3/2001 |
| KR | 10-20010019668 | 3/2001 |
| KR | 10-0297706 | 5/2001 |
| KR | 10-2001-0054739 | 7/2001 |
| KR | 10-20010055071 | 7/2001 |
| KR | 10-20010056037 | 7/2001 |
| KR | 10-2001-0110917 | 12/2001 |
| KR | 10-20020009188 | 2/2002 |
| KR | 10-20020022258 | 3/2002 |
| KR | 10-20020071061 | 9/2002 |
| KR | 10-20020071062 | 9/2002 |
| KR | 10-20020074897 | 10/2002 |
| KR | 10-20020078116 | 10/2002 |
| KR | 10-20020079196 | 10/2002 |
| KR | 10-20020080202 | 10/2002 |
| KR | 10-20030006619 | 1/2003 |
| KR | 10-20030030286 | 4/2003 |

\* cited by examiner

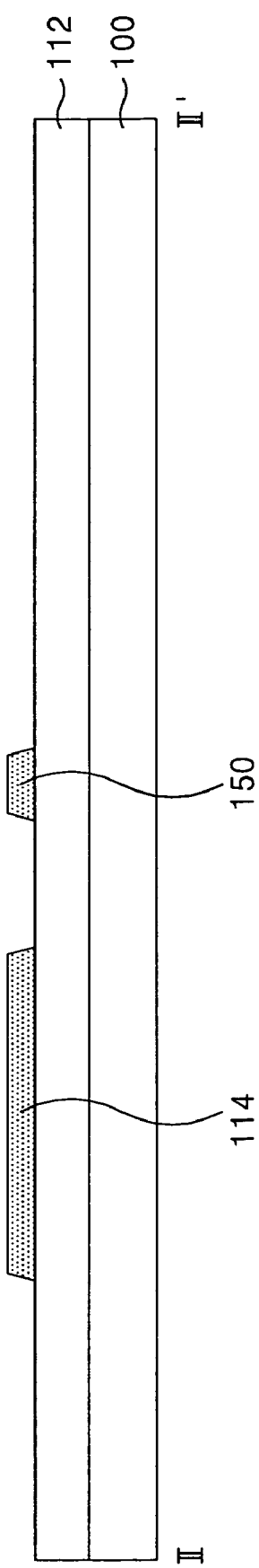

METHOD OF FABRICATING A LIQUID CRYSTAL DISPLAY DEVICE

This application claims the benefit of the Korean Patent Application No. P2004-92683 filed on Nov. 12, 2004, which is hereby incorporated by reference.

BACKGROUND OF THE INVENTION

1. Field of the Invention

The present invention relates to a fabricating method of a thin film transistor substrate of a liquid crystal display panel using polysilicon, and more particularly to a fabricating method of a poly-silicon type thin film transistor substrate that is capable of reducing the number of processes without process defect.

2. Discussion of the Related Art

Generally, a liquid crystal display LCD device has liquid crystal cells, which are arranged in a matrix in a liquid crystal display panel to control the light transmittance of the liquid crystal in accordance with a video signal to thereby display a picture.

A thin film transistor (hereinafter, referred to as "TFT") is used as a switching device to independently supply a video signal to each of the liquid crystal cells. Amorphous silicon or poly-silicon is used as an active layer of the TFT. Poly-silicon has a charge mobility approximately 100 times as fast as amorphous silicon 50, so a high speed drive circuit can be embedded in the liquid crystal display panel by using poly-silicon.

A poly-silicon liquid crystal display panel is formed with a TFT substrate, in which the drive circuit is formed together using the same process used to form the TFT, and a color filter substrate bonded together with liquid crystal therebetween.

FIG. 1 is a plane view illustrating part of a poly-silicon TFT substrate, and FIG. 2 is a sectional diagram illustrating the TFT substrate shown in FIG. 1, taken along the line I-I'.

The TFT substrate shown in FIGS. 1 and 2 includes a TFT 30 connected to a gate line 2 and a data line 4, and a pixel electrode 22 connected to the TFT 30. The TFT 30 is formed as an N-type or P-type, but the example of an N-type is only explained below.

The TFT 30 includes a gate electrode 6 connected to the gate line 2, a source electrode included in the data line 4, and a drain electrode 10 connected to the pixel electrode 22 through a pixel contact hole 20 penetrating a passivation film 18. The gate electrode 6 is formed to overlap a channel area 14C of an active layer 14, which is formed on a buffer film 12, with a gate insulating film 16 therebetween. The source electrode and the drain electrode 10 are formed to have an interlayer insulating film 26 between the gate electrode 6 and the source and drain electrodes. The source electrode 4 and the drain electrode 10 are respectively connected to a source area 14S and a drain area 14D of the active layer 14, into which n+ impurities are implanted, through a source contact hole 24S and a drain contact hole 24D which penetrate the interlayer insulating film 26 and the gate insulating film 16.

The poly-silicon TFT substrate is formed by six mask processes, as in FIGS. 3A to 3F.

Referring to FIG. 3A, the buffer film 12 is formed on a lower substrate 1 and the active layer 14 is formed thereon by a first mask process.

An amorphous silicon is deposited on the buffer film 12 and crystallized by a laser to create a poly-silicon, and then the poly-silicon is patterned by a photolithography process and an etching process using a first mask, thereby forming the active layer 14.

Referring to FIG. 3B, the gate insulating film 16 is formed on the buffer film 12 where the active layer 14 is formed, and the gate line 2 and the gate electrode 6 are formed thereon by a second mask process.

And, n+ impurities are implanted into a non-overlapping area of the active layer 14 using the gate electrode 6 as a mask, thereby forming the source area 14S and the drain area 14D of the active layer 14.

Referring to FIG. 3C, the interlayer insulating film 26 is formed on the gate insulating film 16 where the gate line 2 and the gate electrode 6 are formed, and the source and drain contact holes 24S, 24D penetrating the interlayer insulating film 26 and the gate insulating film 16 are formed by a third mask.

Referring to FIG. 3D, the data line 4 having the source electrode and the drain electrode 10 are formed on the interlayer insulating film 26 by a fourth mask process.

Referring to FIG. 3E, the passivation film 18 is formed on the interlayer insulating film 26 where the data line 4 and the drain electrode 10 are formed, and a pixel contact hole 20 penetrating the passivation film 18 to expose the drain electrode 10 is formed by a fifth mask process.

Referring to FIG. 3F, a transparent pixel electrode 22 is formed on the passivation film 18 by a sixth mask process.

In this way, the related art poly-silicon TFT substrate is formed by the six mask processes, thus its fabricating processes are complicated. This is because one mask process includes many processes like a thin film deposition process, a cleaning process, a photolithography process, an etching process, a photo-resist peeling process, an inspection process and so on. Accordingly, in order to reduce cost, there is required a method that the number of mask processes of the poly-silicon TFT substrate can be reduced without defect.

SUMMARY OF THE INVENTION

Accordingly, the present invention is directed to a method of fabricating a liquid crystal display device that substantially obviates one or more of the problems due to limitations and disadvantages of the related art.

An advantage of the present invention is to provide a fabricating method of a poly-silicon thin film transistor substrate that is capable of reducing the number of processes without process defect.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a liquid crystal display device according to an aspect of the present invention includes the steps of forming first and second conductive layers on a substrate, wherein the first layer is transparent; forming a photo-resist pattern on the second conductive layer; patterning the second conductive layer and the first conductive layer using the photo-resist pattern as a mask; etching at least one lateral part of the patterned second conductive layer by using the photo-resist pattern as a mask; and removing the remaining photo-resist pattern.

In another aspect of the present invention, a method of fabricating a liquid crystal display device, including: forming a buffer film on a substrate; forming an active layer on the buffer film; forming a first insulating film on the active layer;

forming a double conductive layer having first and second conductive layers on the first insulating film; forming a gate line, a gate electrode, and a pixel electrode by patterning the double conductive layer and removing an under-cut part of the first conductive layer of the double conductive layer; forming a second insulating film on the gate line, the gate electrode and the pixel electrode; forming source and drain contact holes exposing source and drain areas of the active layer and a transmission hole exposing a first conductive layer of the pixel electrode; and forming a data line and source and drain electrodes on the second insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6A to 6D are sectional diagrams for explaining a fabricating method of the thin film transistor substrate shown in FIG. 5;

DETAILED DESCRIPTION OF THE PREFERRED EMBODIMENT

Reference will now be made in detail to the preferred embodiments of the present invention, examples of which are illustrated in the accompanying drawings.

With reference to FIGS. 4 to 16, embodiments of the present invention will be explained as follows.

Figure 1:
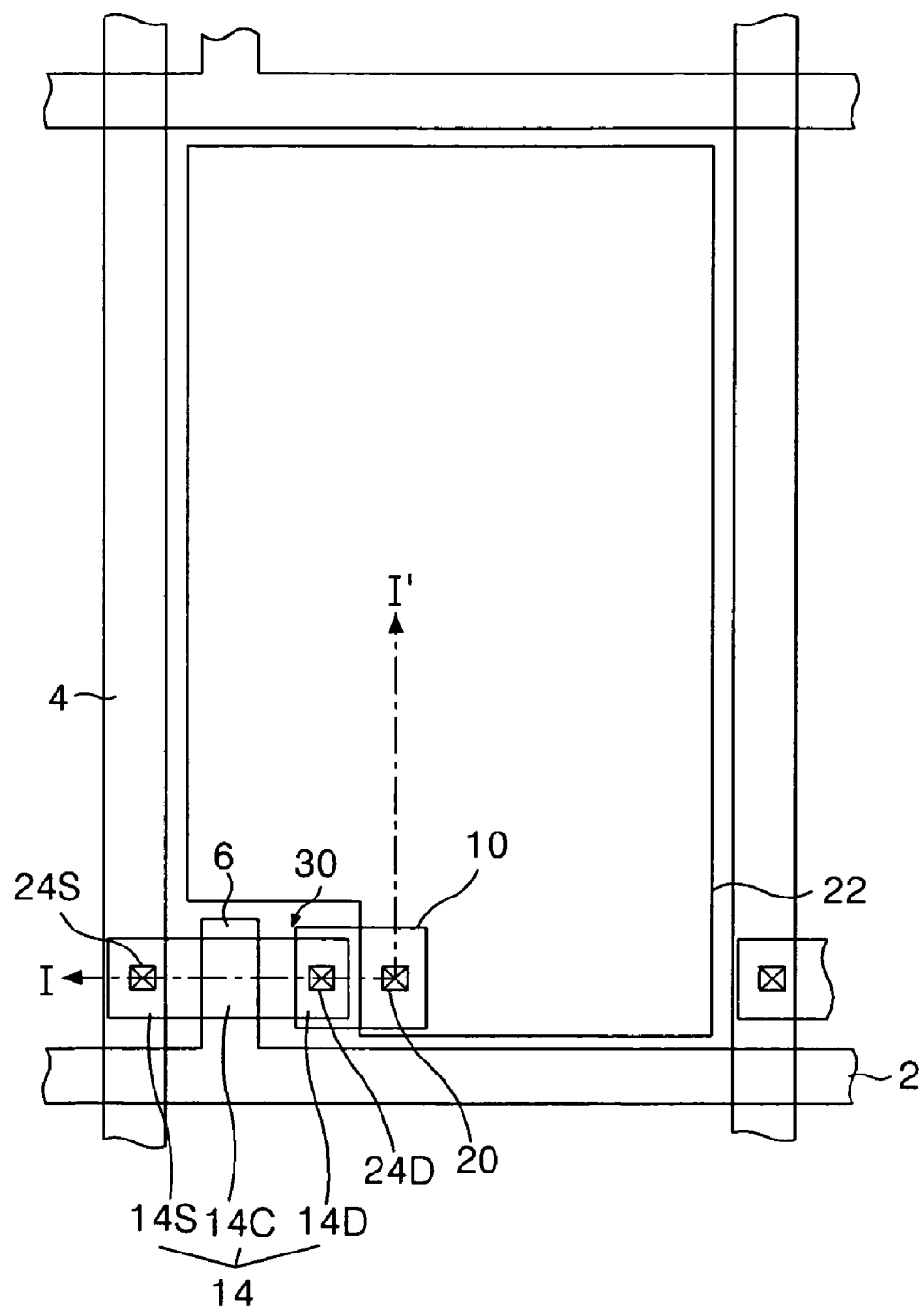
FIG. 1 a plane view illustrating part of a related art poly-silicon thin film transistor substrate.
Figure 2:
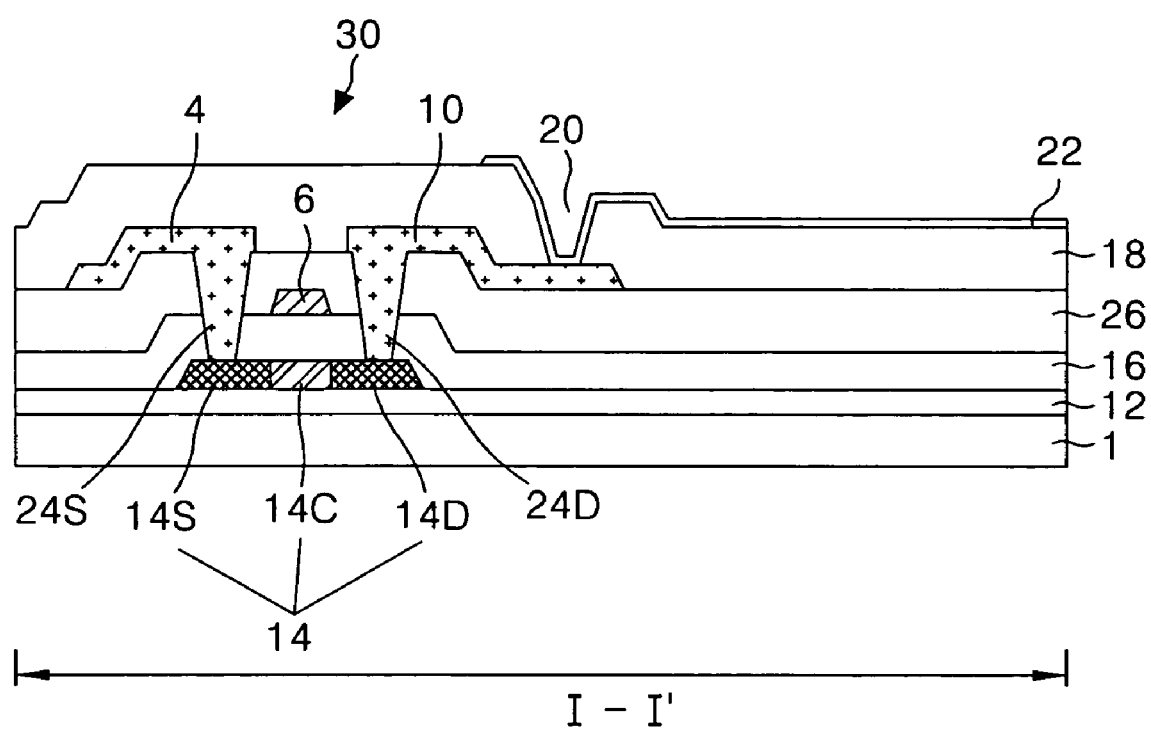
FIG. 2 is a sectional diagram illustrating the thin film transistor shown in FIG. 1, taken along the line I-I'.
Figure 3A:
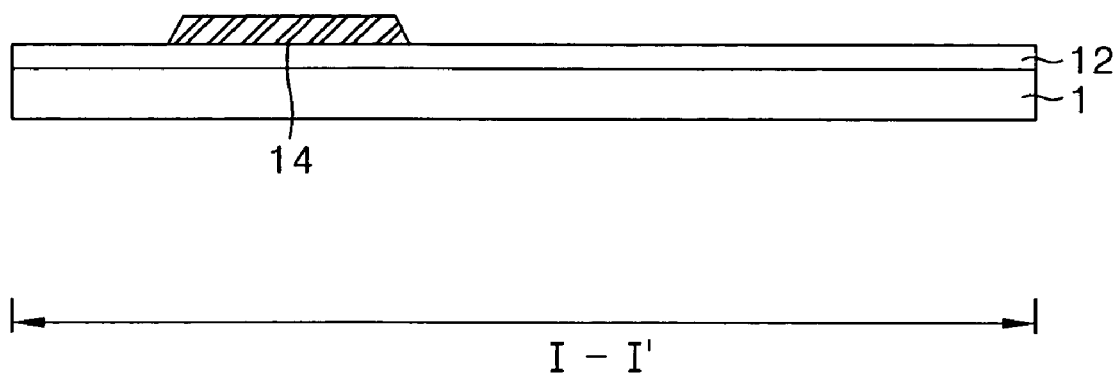
FIGS. 3A to 3F are sectional diagrams for explaining a fabricating method of the thin film transistor substrate shown in FIG. 2.
Figure 3B:
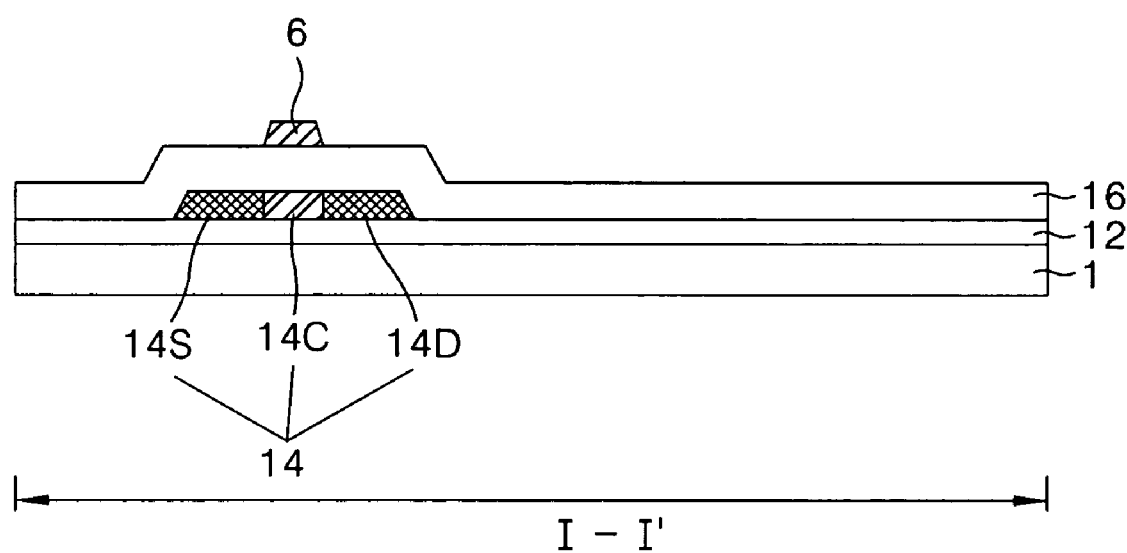
Figure 3C:
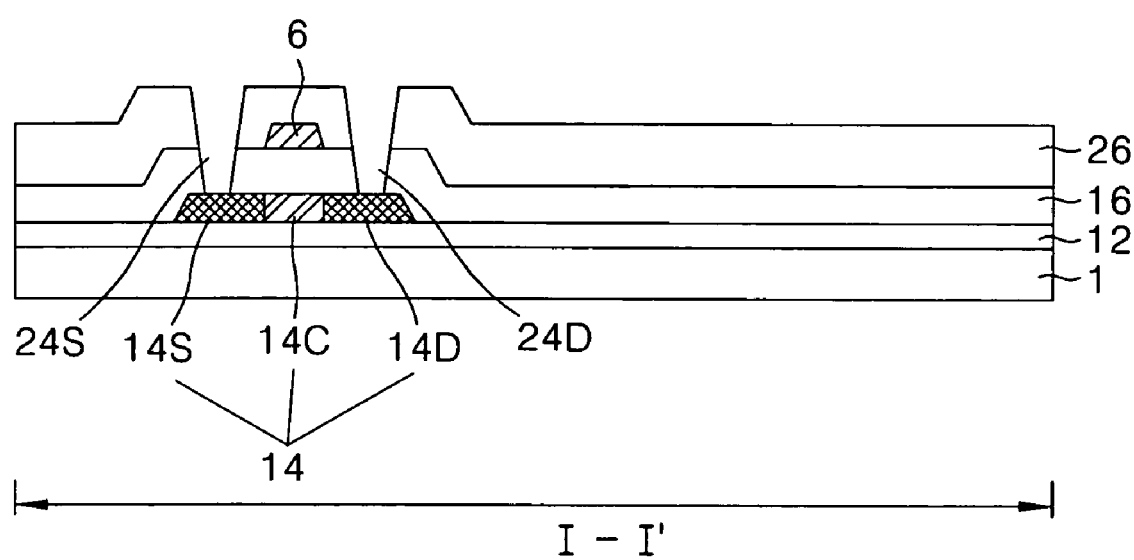
Figure 3D:
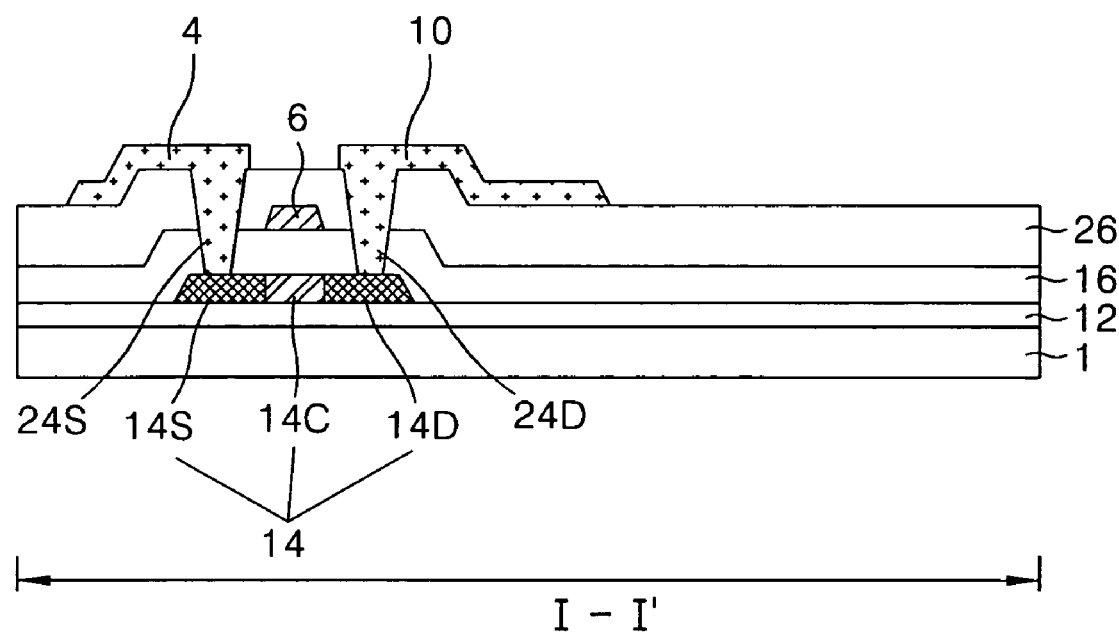
Figure 3E:
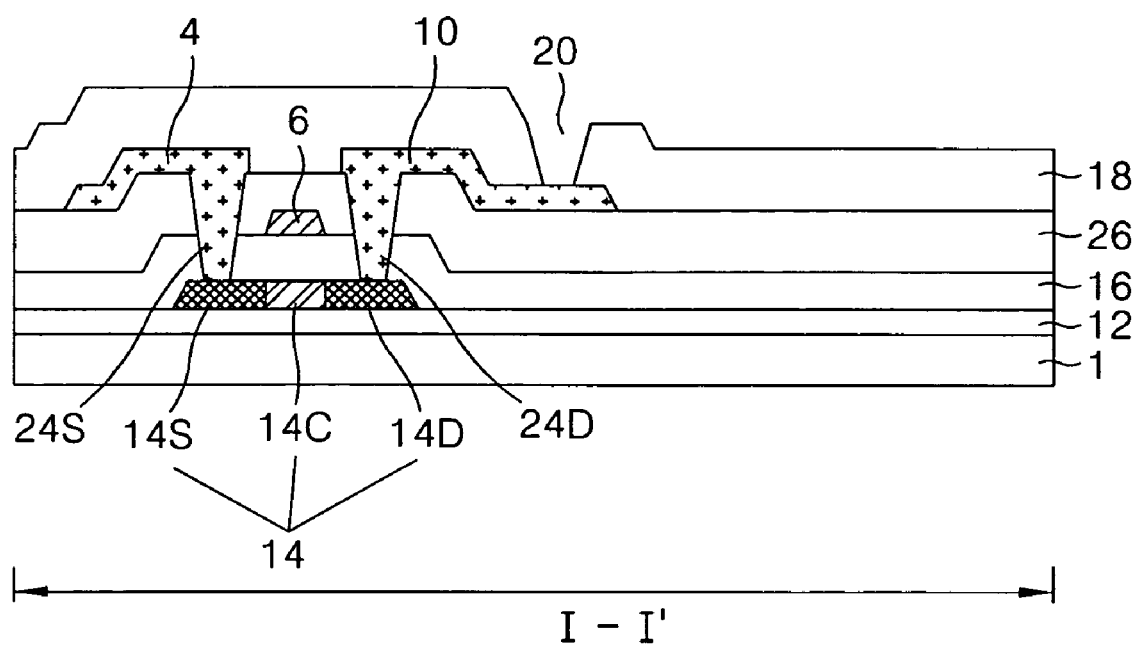
Figure 3F:
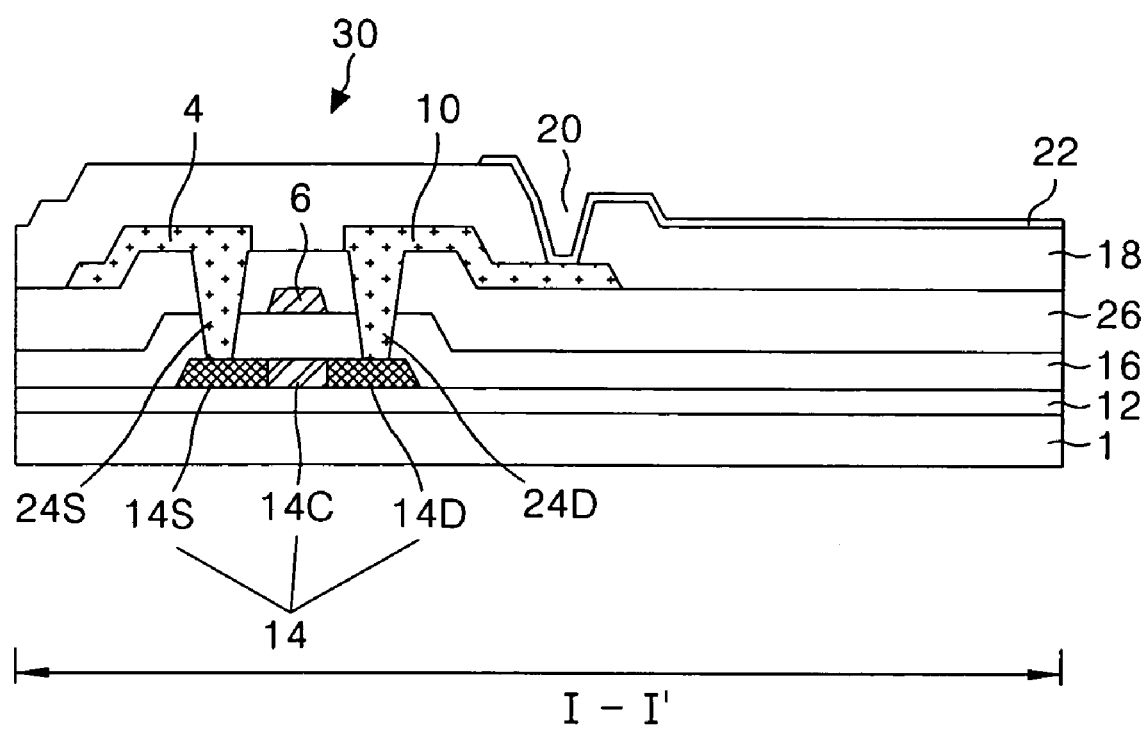
Figure 4:
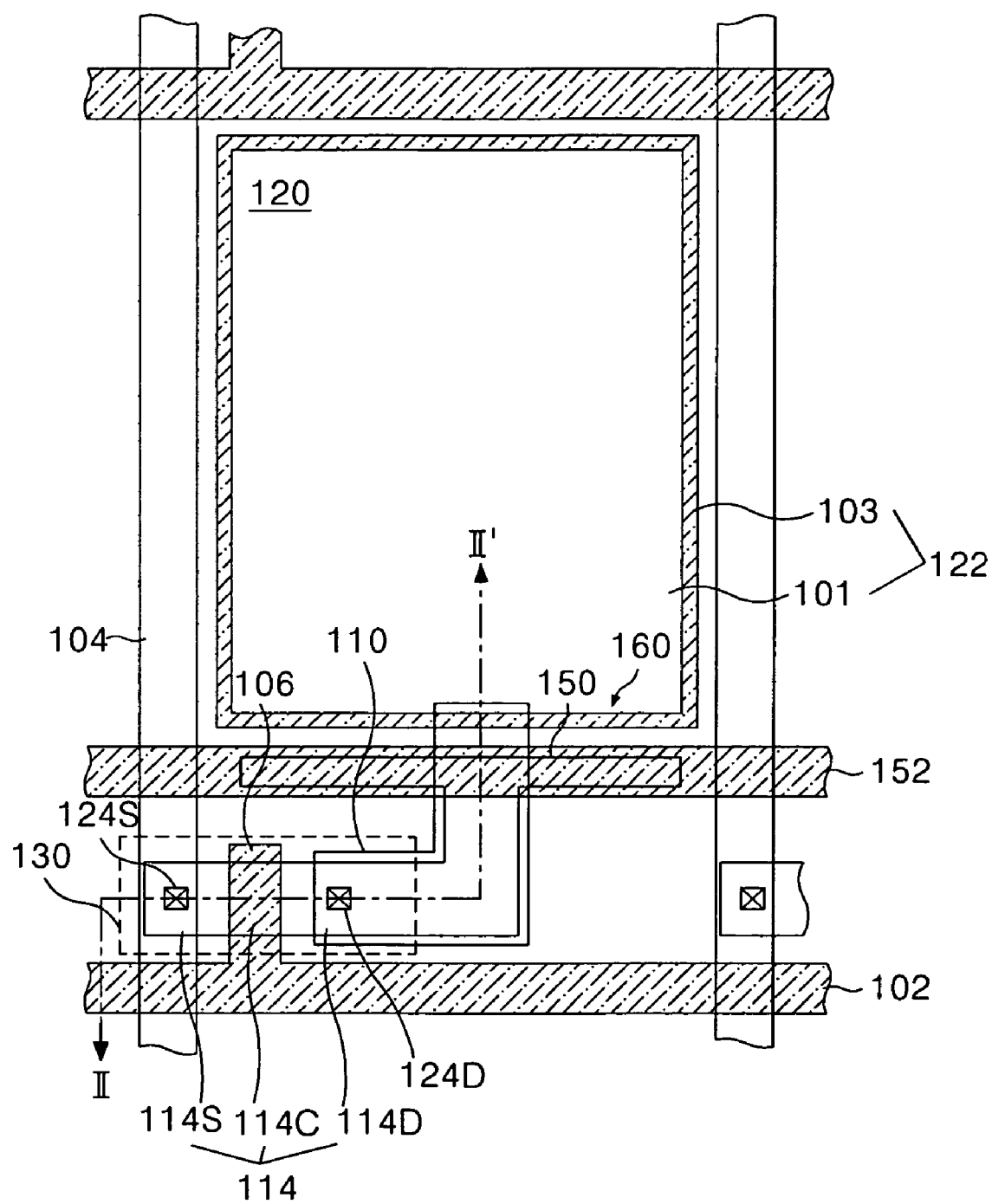
FIG. 4 is a plane view illustrating part of a poly-silicon thin film transistor substrate according to a first embodiment of the present invention.
Figure 5:
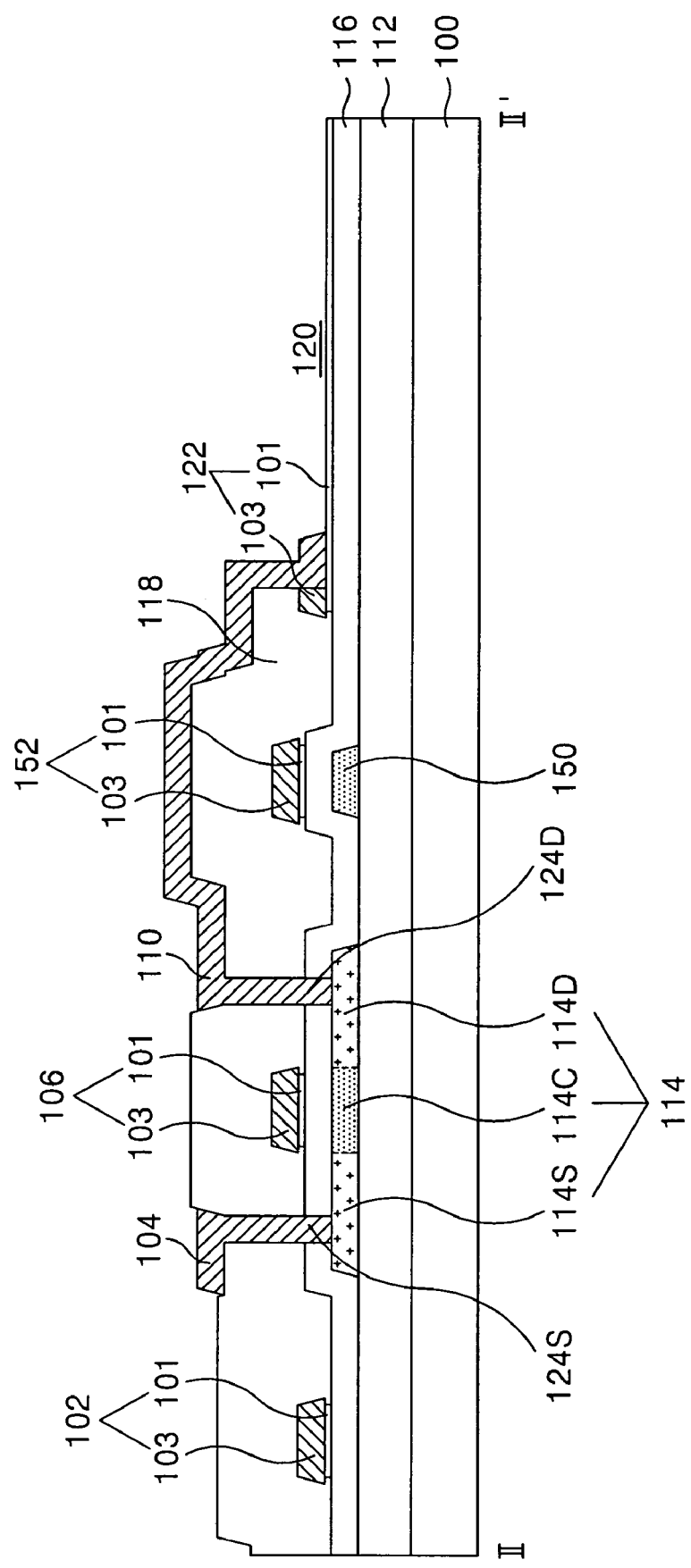
FIG. 5 is a sectional diagram illustrating the thin film transistor substrate shown in FIG. 4, taken along the line II-II'.

FIG. 4 is a plane view illustrating part of a poly-silicon thin film transistor substrate according to a first embodiment of the present invention, and FIG. 5 is a sectional diagram illustrating the TFT substrate shown in FIG. 5, taken along the line II-II'.

The poly-silicon TFT substrate shown in FIGS. 4 and 5 includes a gate line 102 and a data line 104 which define a pixel area; a TFT 130 connected thereto; a pixel electrode 122 and a storage capacitor 160 connected to the TFT; and a storage line 152 connected to the storage capacitor 160. The TFT 130 is formed as an N-type or P-type, but the example of an N-type is only explained below.

The data line 104 crosses the gate line 102 and the storage line 152 with an interlayer insulating film 118 therebetween to define the pixel area where the pixel electrode 122 is formed.

The TFT 130 supplies a video signal on the data line 104 to the pixel electrode 122 in response to a gate signal on the gate line 102. For this, the TFT 130 includes a gate electrode 106 connected to the gate line 102; a source electrode included in the data line 104; a drain electrode 110 connected to the pixel electrode 122; and a first active layer 114 which forms a channel between the source electrode and the drain electrode 110.

Herein, the gate line 102 and the gate electrode 106 together with the storage line 152 have a double layer structure where a transparent conductive layer 101 is formed and a metal layer 103 is formed thereon.

The first active layer 114 is formed on a lower substrate 100 with a buffer film 112 therebetween. The first active layer 114 includes a channel area 114C which overlaps the gate electrode 106 with a gate insulating film 116 therebetween, and a source area 114C and a drain area 114D into which n+ impurities are implanted and which have the channel area 114C therebetween. The source area 114S and the drain area 114D of the first active layer 114 are respectively connected to the source electrode included in the data line 104 and the drain electrode 110 through a source contact hole 124S and a drain contact hole 124D which penetrate an interlayer insulating film 118 and a gate insulating film 116.

The pixel electrode 122 like the gate line 102, the gate electrode 106, and the storage line 152 have the double layer structure where the transparent conductive layer 101 and the metal layer 103 are formed on the gate insulating film 116. The transparent conductive layer 101 of the pixel electrode 122 is exposed through a transmission hole 120 for transmitting light that penetrates the interlayer insulating film 118 and the metal layer 103. Herein, the metal layer 103 of the pixel electrode 122 has a remaining overlapping part between the interlayer insulating film 118 and the transparent conductive layer 101 along the boundary of the transmission hole 120. And, the pixel electrode 122 connects to the drain electrode 110 that crosses the storage line 152 from the TFT 130 and extends along the side surface of an aperture part 120. Specifically, the drain electrode 110 is connected to the metal layer 103 and transparent conductive layer 101 of the pixel electrode 122 that is exposed through the transmission hole 120. The pixel electrode 122 is charged with a video signal supplied by the thin film transistor 130 to generate a potential difference with a common electrode that is formed on a color filter substrate (not shown). The potential difference causes the liquid crystal located between the thin film transistor substrate and the color filter substrate to rotate by dielectric anisotropy and to control the transmittance of light which is incident through the pixel electrode 122 from a light source (not shown) so as to transmit the incident light toward the color filter substrate.

A storage capacitor 160 includes first and second storage capacitors connected in parallel between the TFT 130 and the storage line 152. The first storage capacitor is formed where the storage line 152 overlaps a second active layer 150 extending from the first active layer 114 with the gate insulating film 112 therebetween. The second storage capacitor is formed where the drain electrode 110 crosses the storage line 152 with the interlayer insulating film 118 therebetween. The storage capacitor 160 receives the video signal applied to the pixel electrode 120 to stably sustain the charge on the pixel electrode 120.

In this way, the poly-silicon TFT substrate of the present invention has the pixel electrode 122 formed together with the gate line 102, the gate electrode 106, and the storage line 152, which have the double layer structure. As a result, it may be formed using four mask processes as shown in FIGS. 6A to 6D.

Referring to FIG. 6A, the buffer film 112 is formed on the lower substrate 100, and the integrated first and second active layers 114 and 150 are formed thereon by a first mask process.

An amorphous silicon thin film is formed on the buffer film 112 by a method such as LPCVD (low pressure chemical vapor deposition), PECVD (plasma enhanced chemical vapor deposition), etc., and then the amorphous silicon film is crystallized to form a poly-silicon thin film. Next, a de-hydrogenation process is performed to remove hydrogen atoms present within the amorphous silicon thin film before crystallizing the amorphous silicon thin film.

Examples of amorphous silicon thin film crystallization methods include the SPC (solid phase crystallization) method where the amorphous silicon thin film is heat-treated in a high temperature furnace and an ELA (excimer laser annealing) method where a laser is used. The excimer laser annealing method is mainly used among them. For the excimer laser annealing method, a sequential lateral solidification (hereinafter, referred to as "SLS") method is primarily used where a laser beam line is scanned in a horizontal direction to make a grain grow in the horizontal direction, thereby improving its crystallization characteristic. The SLS method uses the principle that the grain grows at a border surface of liquid phase silicon and solid phase silicon in a direction horizontal to the border surface. Accordingly, the SLS method has an advantage in that the irradiation range of the laser beam and the magnitude of the laser energy are properly controlled to make the grain grow as long as a designated length in the horizontal direction, thereby improving the size of the grain.

Then, the poly-silicon thin film is patterned by the photolithography process and the etching process using a first mask process to form the integrated first and second active layers 114, 150.

Figure 6B:
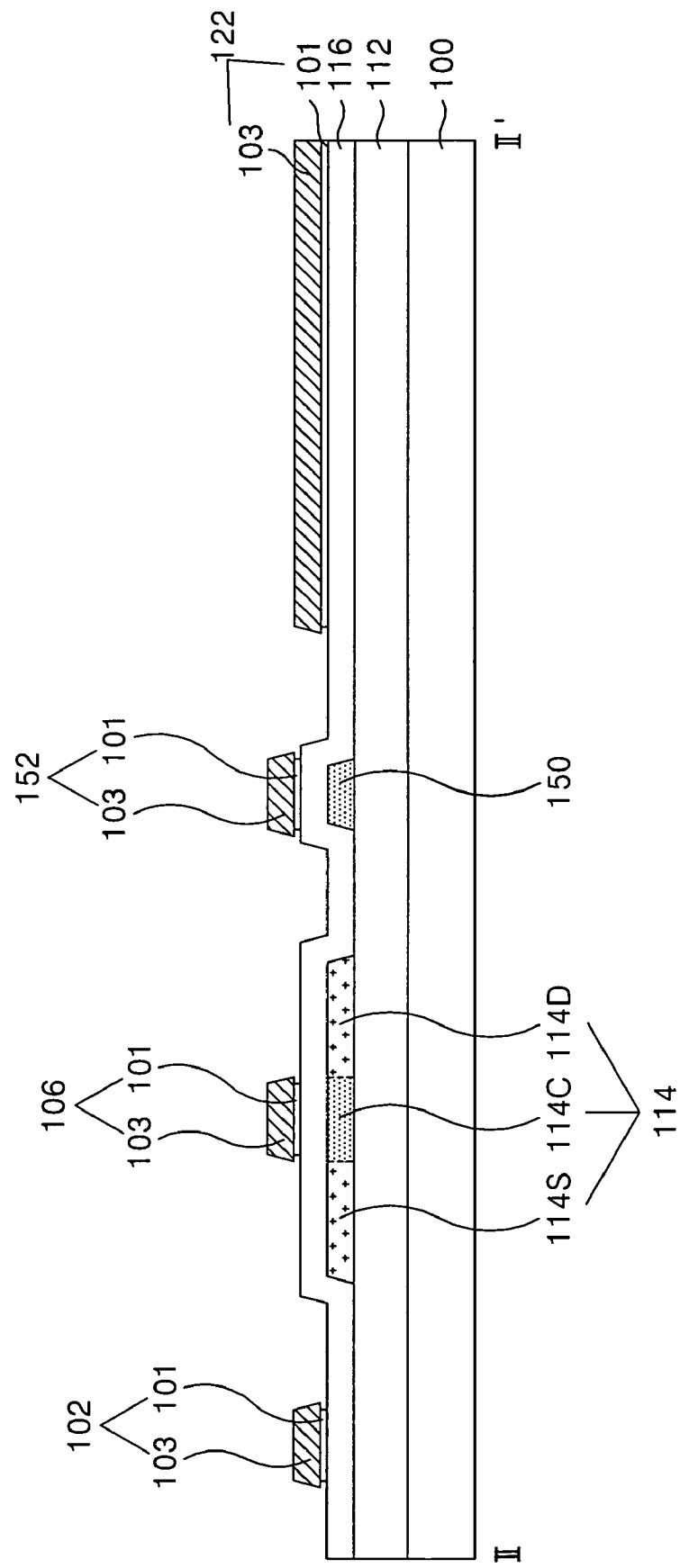

Referring to FIG. 6B, the gate insulating film 116 is formed, and the pixel electrode 122 is formed thereon together with the gate line 102, the gate electrode 106, and the storage line 152, which have the double layer structure.

The gate insulating film 116, the transparent conductive layer 101, and the metal layer 103 are deposited on the buffer film 112 where the first and second active layers 114, 150 are formed. The transparent conductive layer 101 and the metal layer 103 are patterned by the photolithography process and the etching process using a second mask, thereby forming the gate line 102, the gate electrode 106, the storage line 152, and the pixel electrode 122 having the double layer structure.

Next, N+ impurities are implanted into the first active layer 114 using the gate electrode 106 as a mask to form the source area 114S and drain area 114D of the first active layer 114.

Figure 6C:
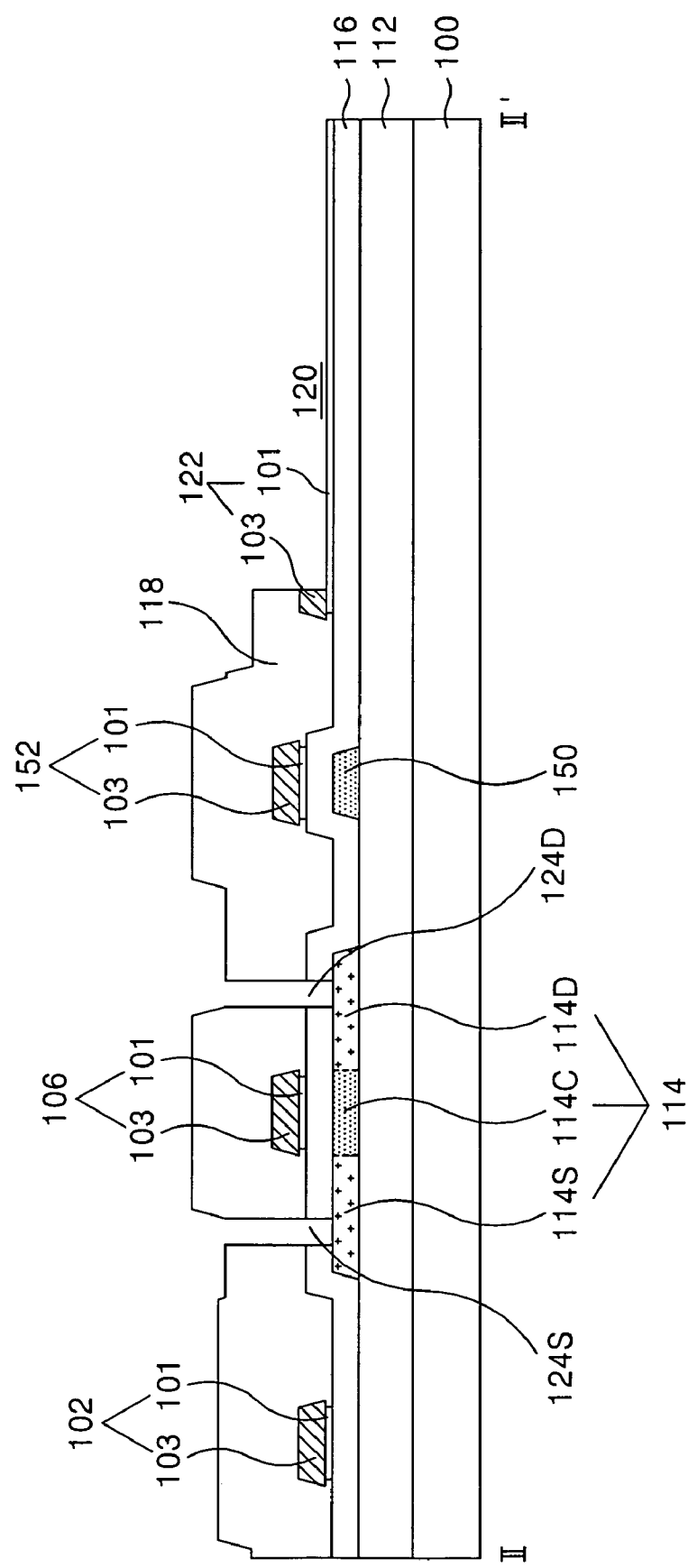

Referring to FIG. 6C, the interlayer insulating film 118 is formed having source and drain contact holes 124S, 124D and the transmission hole 120 by a third mask process.

The interlayer insulating film 118 is formed on the gate insulating film 116 over the gate line 102, the gate electrode 106, the storage line 152, and the pixel electrode 122. Then, the transmission hole 120 which exposes the pixel electrode 122 and the source and drain contact holes 124S, 124D which respectively exposes the source area 114S and drain area 114D of the first active layer 114 are formed by penetrating the interlayer insulating film 118 and the gate insulating film 116, using the photolithography process and the etching process using a third mask.

Figure 6D:
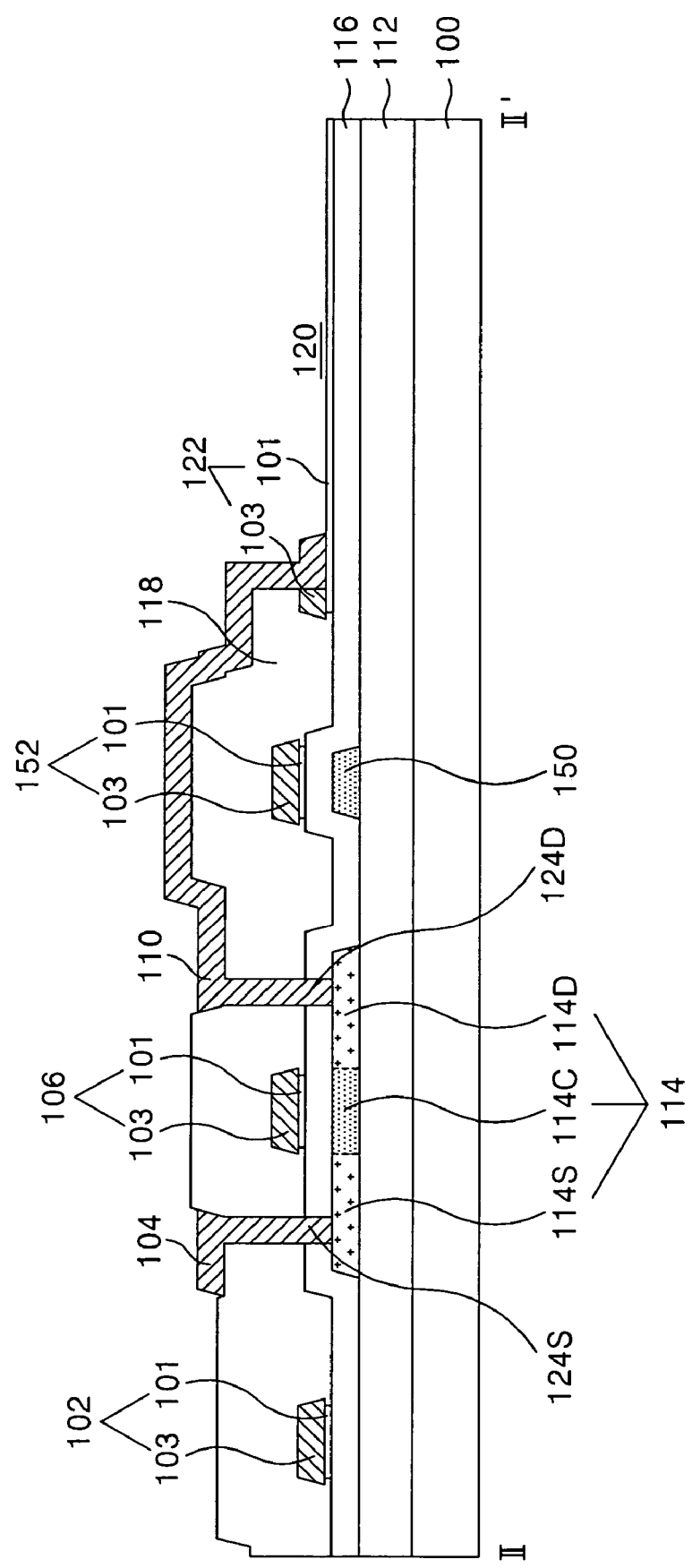
Figure 7:
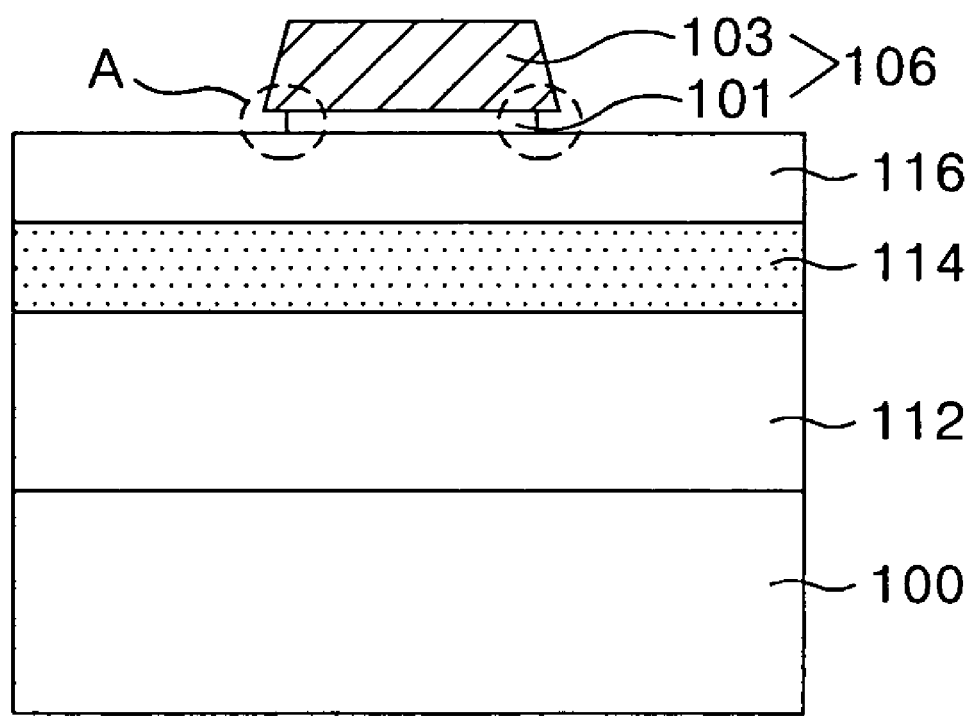
FIG. 7 is a sectional diagram illustrating an enlarged gate electrode part shown in FIG. 6B.

Referring to FIG. 6D, the drain electrode 110 and the data line 104 having the source electrode are formed on the interlayer insulating film 118 using a fourth mask process.

The drain electrode 110 and the data line 104 having the source electrode are formed by patterning a source/drain metal layer using the photolithography process and the etching process using a fourth mask after forming the source/drain metal layer on the interlayer insulating film 118. The data line 104 and the drain electrode 110 are respectively connected to the source area 114S and drain area 114D of the first active layer 114 through the source and drain contact holes 124S, 124D. The drain electrode 110 extends to cross the storage line 152 to be connected to the metal layer 103 and transparent conductive layer 101 of the pixel electrode 122 that is exposed through the transmission hole 120.

In this way, the poly-silicon TFT substrate of the present invention has the pixel electrode 122 formed together with the gate line 102, the gate electrode 106, and the storage line 152 which have the double layer structure, thus the process may be simplified to four mask processes. As a result, the data line 104 has a structure where the drain electrode 110 is exposed, but this may be made to be sufficiently protected by an alignment film of an organic insulating material that is formed to be the uppermost layer of the TFT substrate for the liquid crystal alignment of the following process.

In the second mask process of the present invention, the transparent conductive layer 101 and the metal layer 103 of the double layer structure are patterned, the metal layer 103 of the upper part is etched, and then the transparent conductive layer 103 of the lower part is etched. This is because there is no etchant for simultaneously etching the transparent conductive layer 101 and the metal layer 103. Hereby, like the gate electrode 106 shown in FIG. 7, there is a disadvantage in that the transparent conductive layer 101 of the lower part is over-etched versus the metal layer 103 generating an under-cut part (A). FIG. 8A to 8D show, the cause of the under-cut part (A) of the transparent conductive layer 101.

Figure 8A:
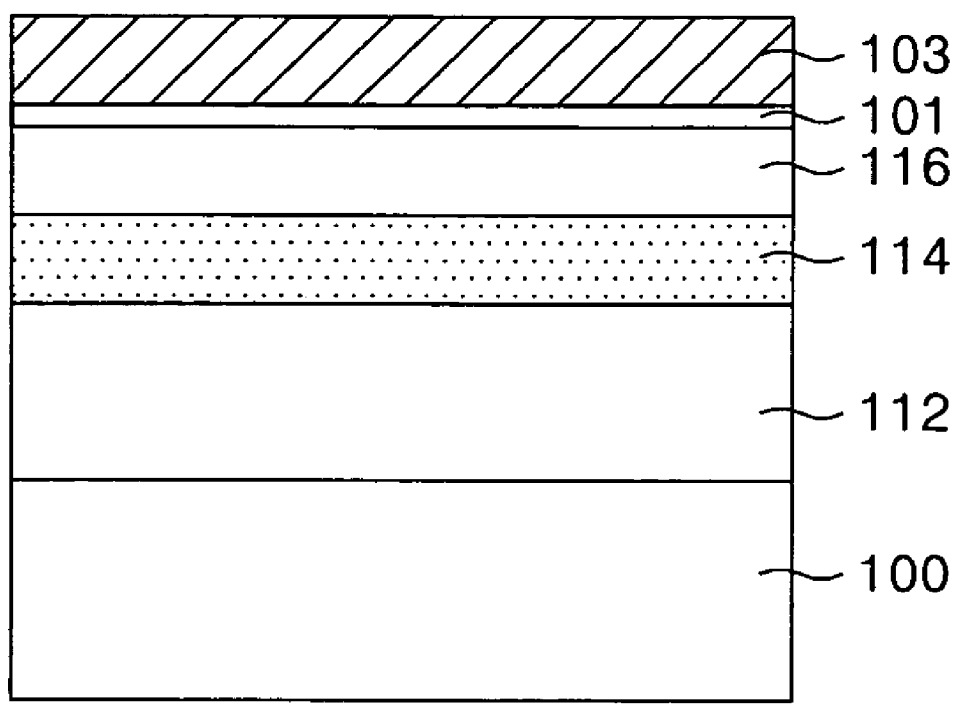
FIGS. 8A to 8D are sectional diagrams for explaining a method of forming the gate electrode shown in FIG. 7.

Referring to FIG. 8A, the transparent conductive layer 101 and the metal layer 103 are sequentially formed by a deposition method such as sputtering on the substrate 100 where the buffer film 112, the first active layer 114, and the gate insulating film 116 are deposited.

Figure 8B:
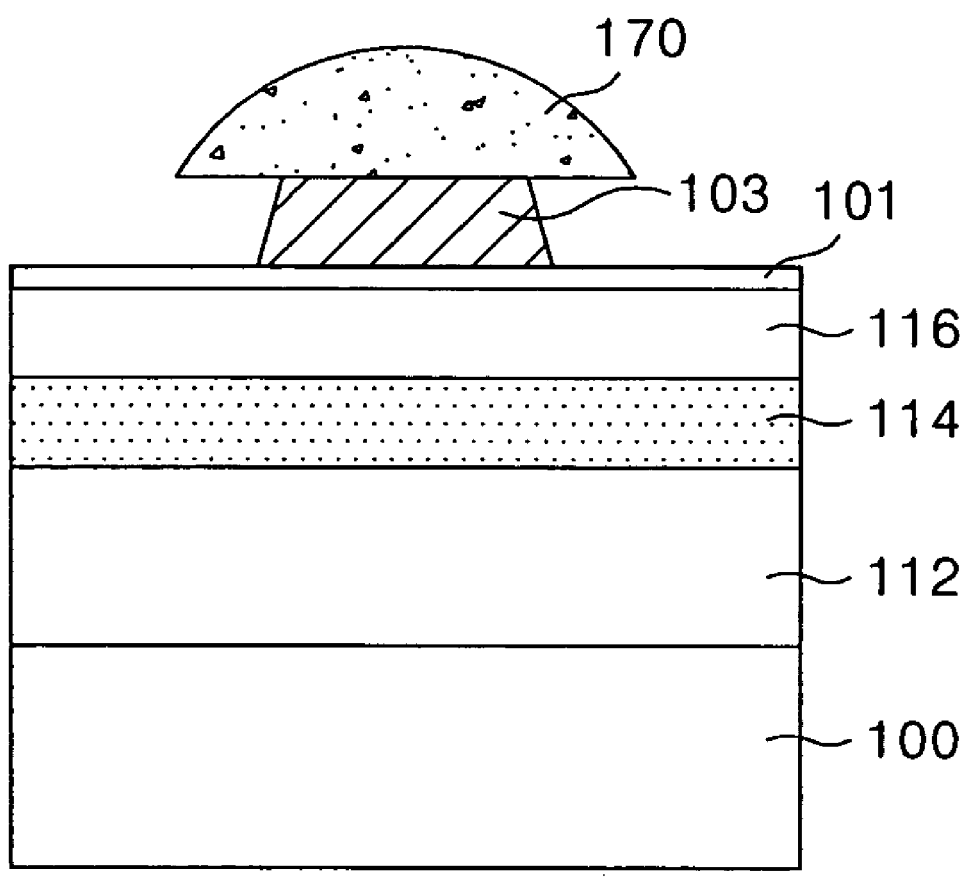

And then, as shown in FIG. 8B, a photo-resist pattern 170 is formed on the metal layer 103 by a photolithography process using a second mask, and part of the metal layer 103 that is exposed through the photo-resist pattern 170 is etched by a wet etching method.

Figure 8C:
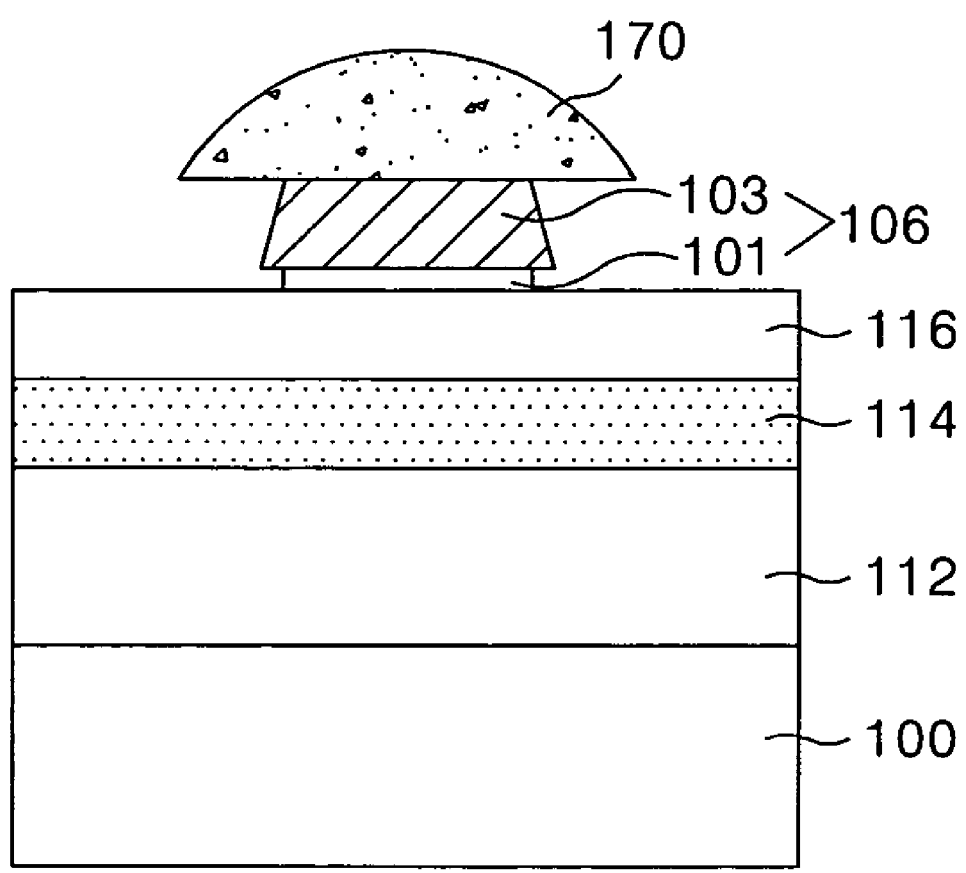

Subsequently, as shown in FIG. 8C, the transparent conductive layer 101 is patterned by the wet etching method using the photo-resist pattern 170 and the patterned metal layer 103 as a mask. In this case, the transparent conductive layer 101 is over-etched by the etchant that penetrates under the edge part of the patterned metal layer 103. As a result, an under-cut part (A) is generated where the edge of the patterned transparent conductive layer 101 is located inside the edge of the patterned metal layer 103.

Figure 8D:
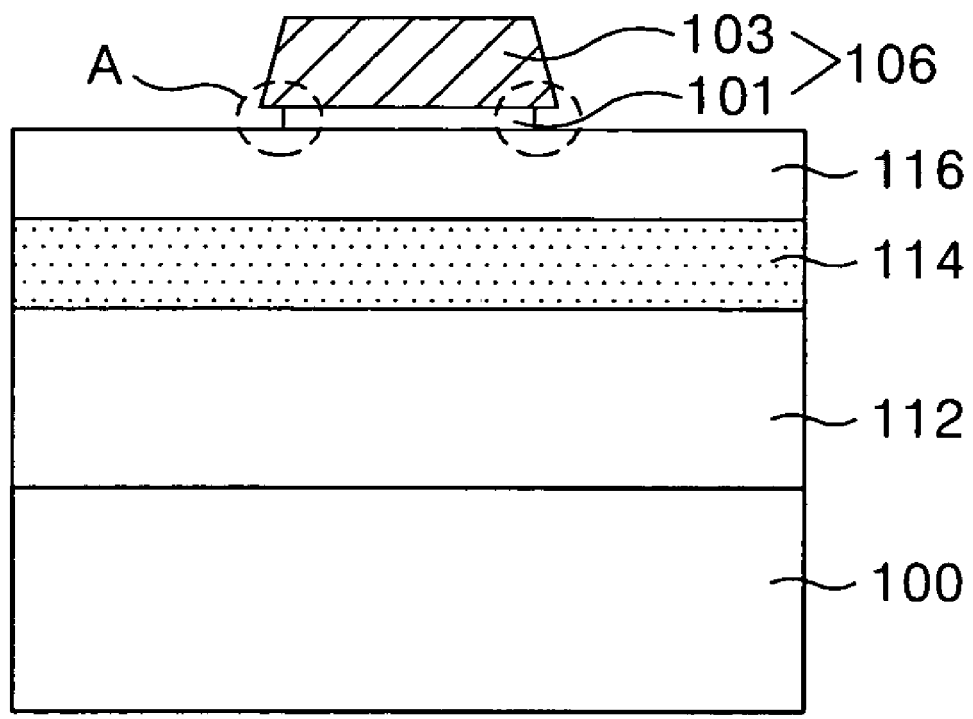

As shown in FIG. 8D, the photo-resist pattern 170 is removed by a stripping process to complete the gate electrode 103.

In such a gate electrode 106, the under-cut part (A) of the transparent conductive layer 101 results in a resistance increase of the first active layer 114. As a result, because of the deterioration of the TFT 130, the video signal voltage supplied from the TFT 130 to the pixel electrode 122 drops. Further, because of the under-cut part (A) of the transparent conductive layer 101 being the lower part of the gate electrode 106, a step coverage defect in the interlayer insulating film 118 formed in the next process results.

In order to solve this problem, the second mask process for the poly-silicon type TFT substrate according to the second embodiment of the present invention, as shown in FIGS. 9A to 9D, removes the under-cut part of the transparent conductive layer 201 of the lower part.

Figure 9A:
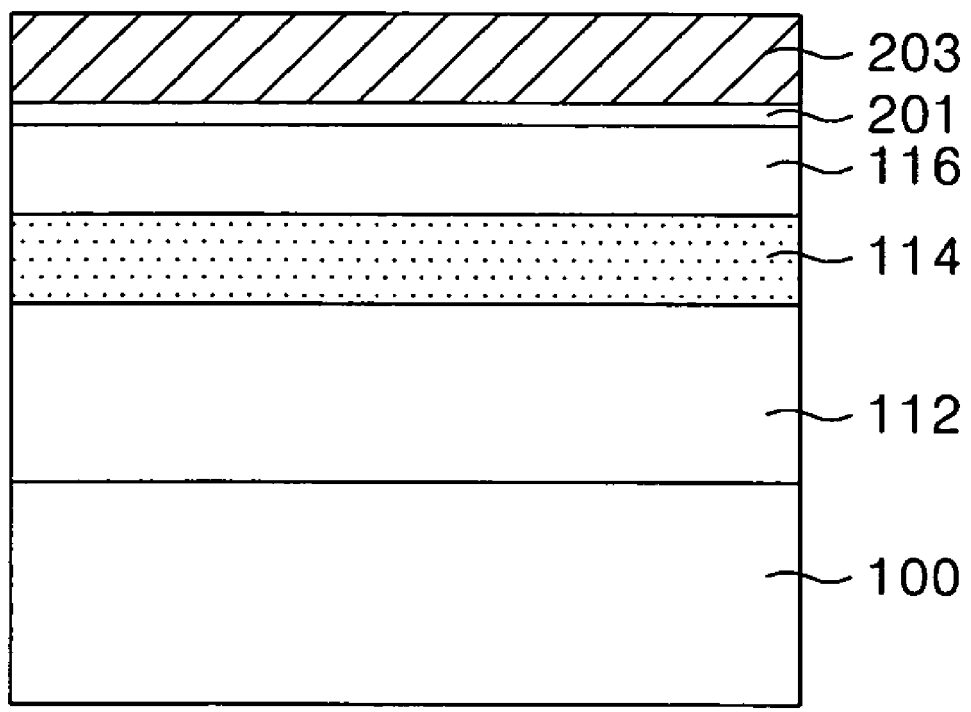
FIGS. 9A to 9D are sectional diagrams for explaining a method of forming a gate electrode in a poly-silicon thin film transistor substrate according to a second embodiment of the present invention.

Referring to FIG. 9A, the transparent conductive layer 201 and the metal layer 203 are sequentially formed by a deposition method such as sputtering on the substrate 100 where the buffer film 112, the first active layer 114, and the gate insulating film 116 are deposited.

Figure 9B:
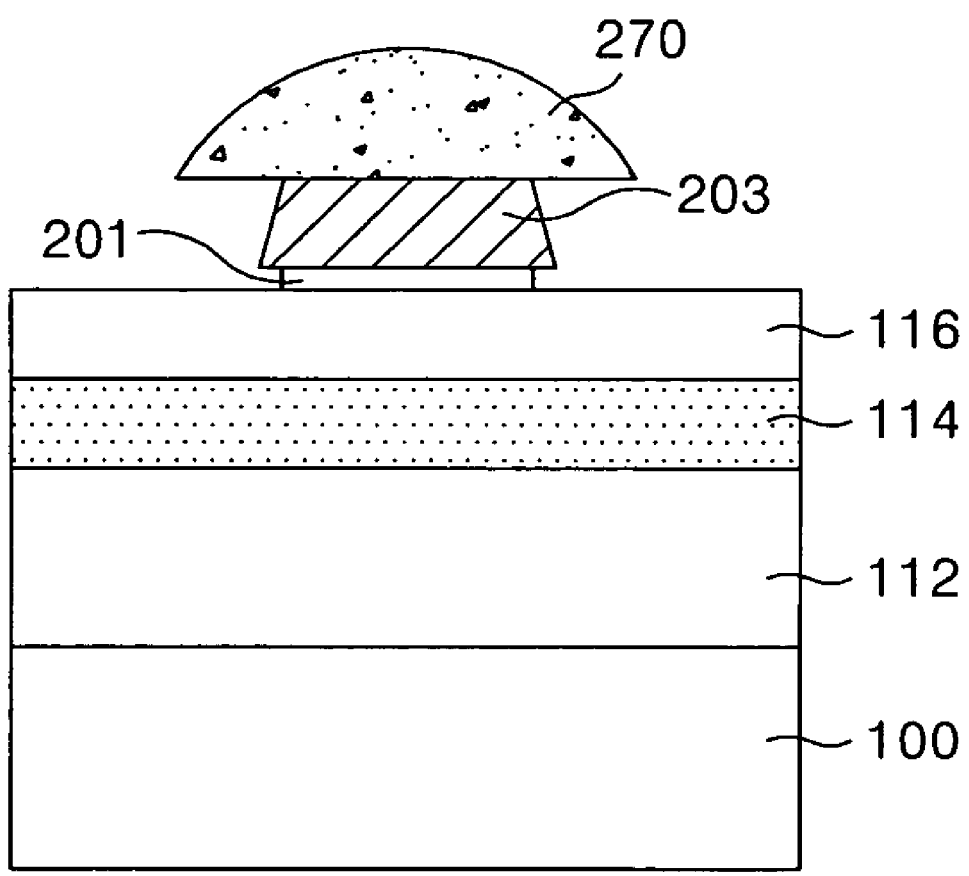

And then, as shown in FIG. 9B, the photo-resist pattern 270 is formed on the metal layer 203 by a photolithography process using a second mask. After the metal layer 203 exposed by the photo-resist pattern 270 is patterned by a first wet etching process, the transparent conductive layer 201 is patterned by a second wet etching process. In this case, the transparent conductive layer 201 is over-etched by an etchant that penetrates under the edge part of the metal layer 203 that is patterned in the second wet etching process.

Figure 9C:
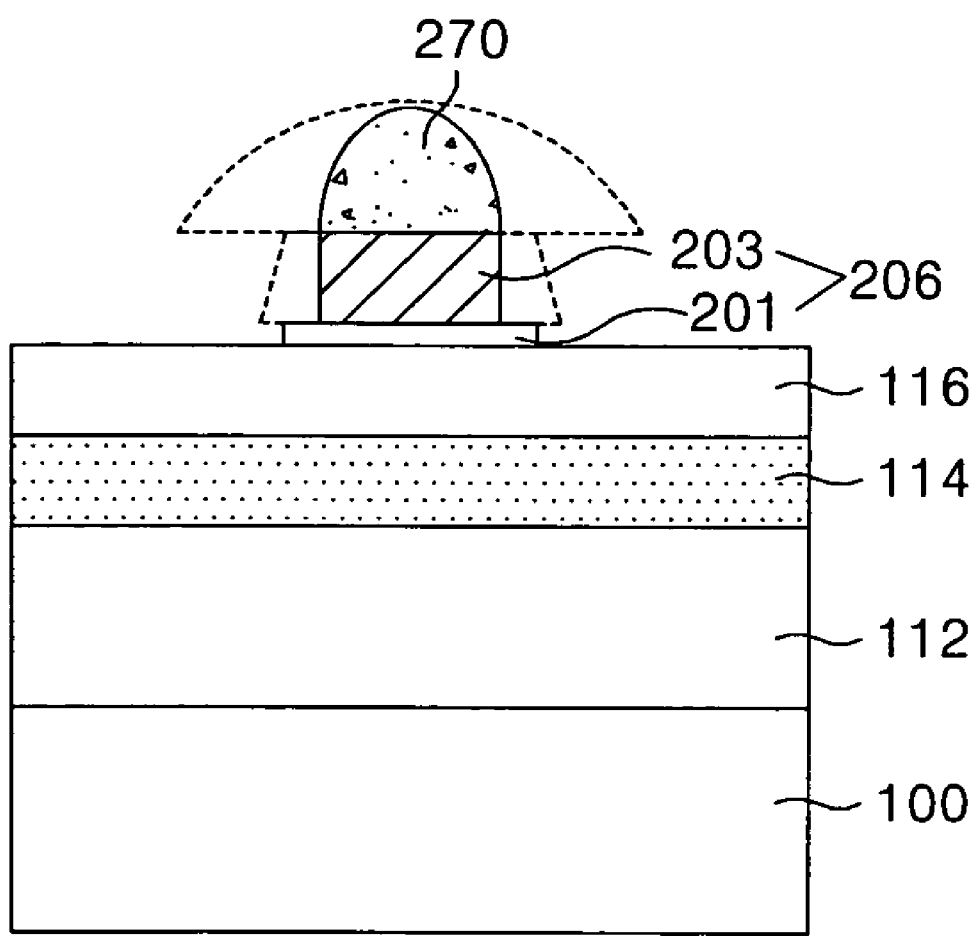

Subsequently, as shown in FIG. 9C, part of the photo-resist pattern 270 is ashed to remove the edge part of the photo-resist pattern 270 so that the upper edge portions of the patterned metal layer 203 are exposed. Both side portions of the metal layer 203 that are now exposed are etched by a dry etching process. Accordingly, the edge of the metal layer 203 is located inside the edge of the transparent conductive layer 201.

Figure 9D:
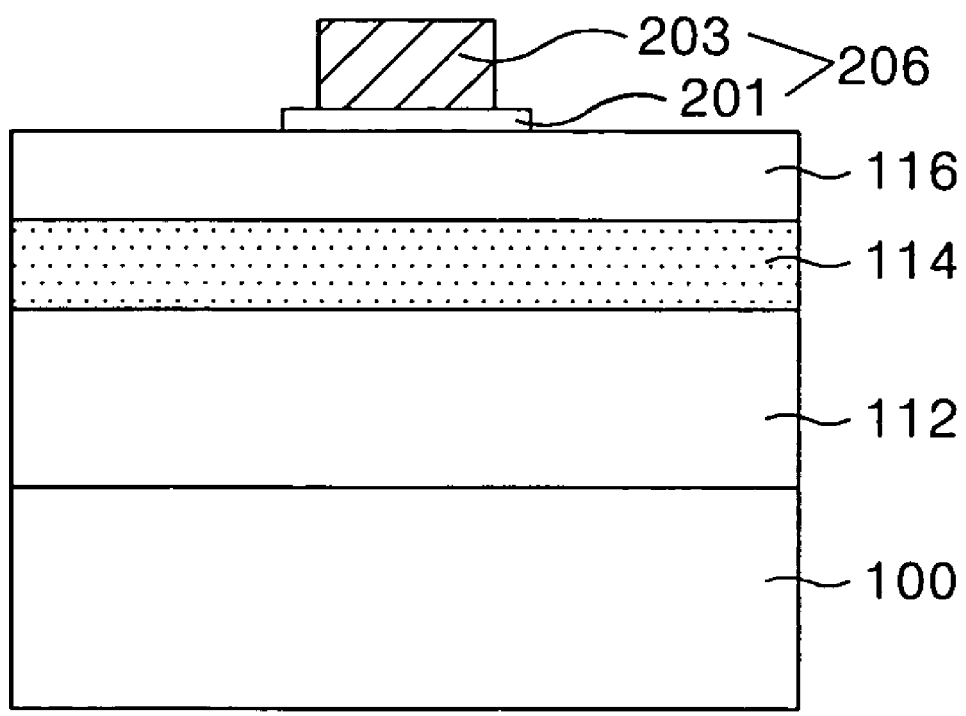

Next, the photo-resist pattern 270 shown in FIG. 9C is removed using a stripping process to complete the gate electrode 206 of the double layer structure, as shown in FIG. 9D.

As a result, in the gate electrode 206 according to the second embodiment of the present invention, the under-cut part of the transparent conductive layer 201 is not formed, thus it is possible to prevent the TFT characteristic deterioration and process defect caused thereby.

Figure 10:
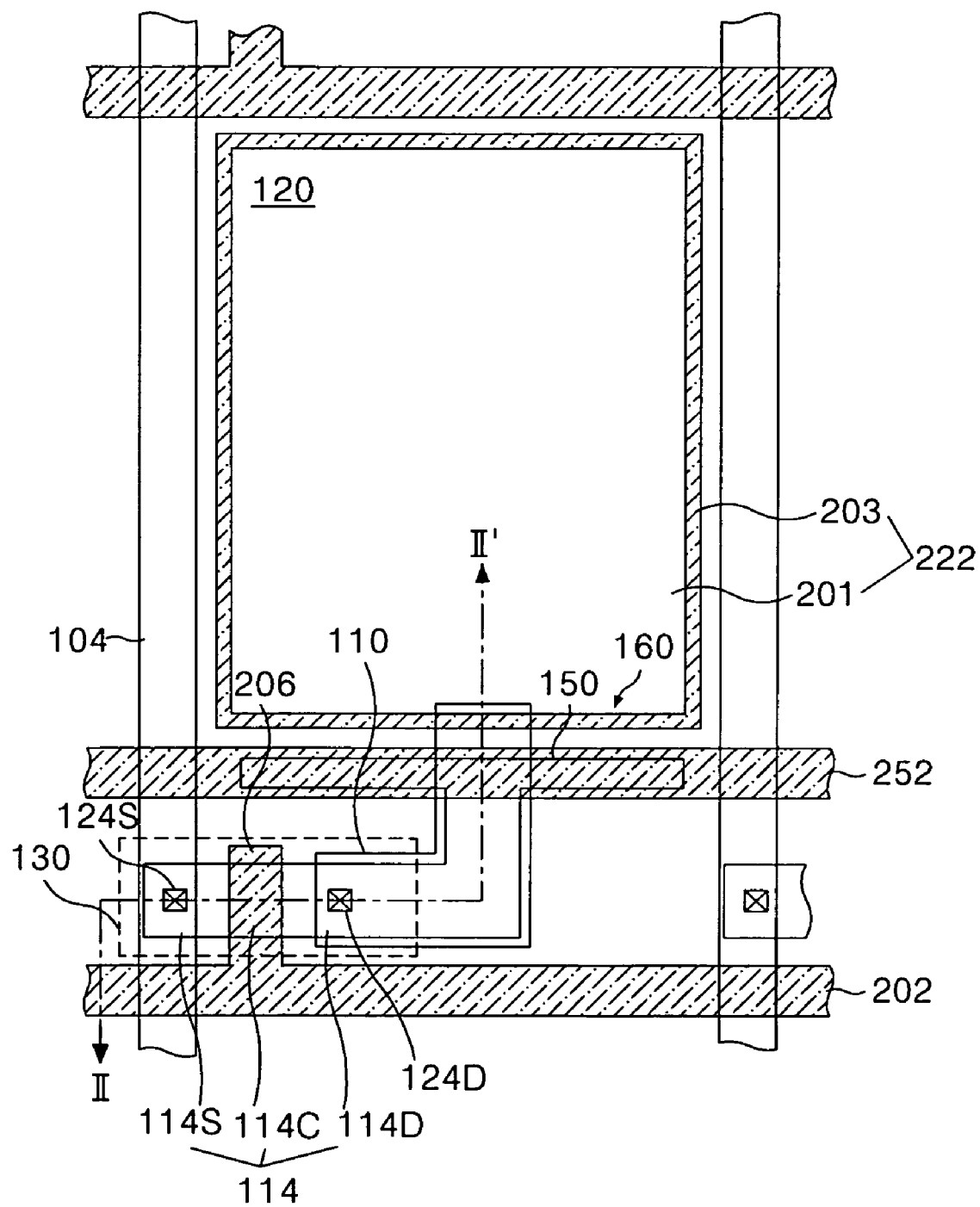
FIG. 10 is a plane view illustrating part of the poly-silicon thin film transistor according to the second embodiment of the present invention.
Figure 11:
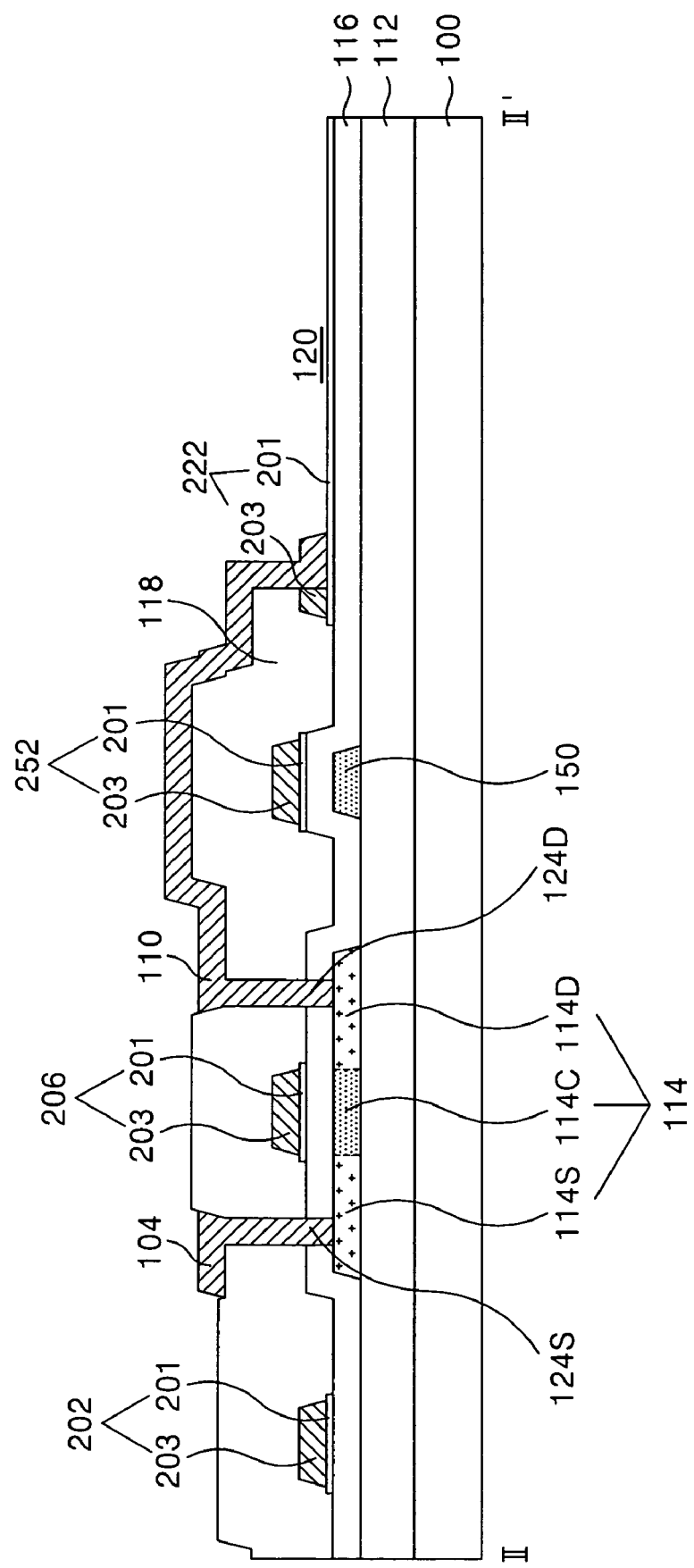
FIG. 11 is a sectional diagram illustrating the thin film transistor substrate shown in FIG. 10, taken along the line II-II'.

FIGS. 10 and 11 are a plane view and a sectional diagram illustrating the poly-silicon TFT substrate according to the second embodiment of the present invention using the foregoing second mask process.

The poly-silicon TFT substrate shown in FIGS. 10 and 11 includes the same components as the TFT substrate shown in FIGS. 4 and 5 except that a gate line 202, a gate electrode 206, a storage line 252, and a pixel electrode 222 have a different double layer structure therefrom, thus the description for the repeated components will be omitted.

In the poly-silicon TFT substrate shown in FIGS. 10 and 11, the gate line 202, the gate electrode 206, the storage line 252, and the pixel electrode 222 have a double layer structure where the transparent conductive layer 201 and the metal layer 203 are deposited on the gate insulating film 116. The transparent conductive layer 201 of the pixel electrode 222 is exposed through the contact hole 120 that penetrates the interlayer insulating film 118 and the metal layer 203. In such a double layer structure, the edge of the lower transparent conductive layer 201 is formed to be located outside the upper metal layer 203. Accordingly, the under-cut part of the transparent conductive layer 201 is not formed, thus the characteristic deterioration of the TFT 130 caused thereby may be prevented, and it is possible to prevent the step coverage defect of the interlayer insulating film 118 where the interlayer insulating film opens at the edge part of the transparent conductive layer 201.

Hereinafter, in reference to FIGS. 12A to 15B, a fabricating method of the poly-silicon TFT substrate according to the second embodiment of the present invention shown in FIGS. 10 and 11 will be described in detail.

Figure 12A:
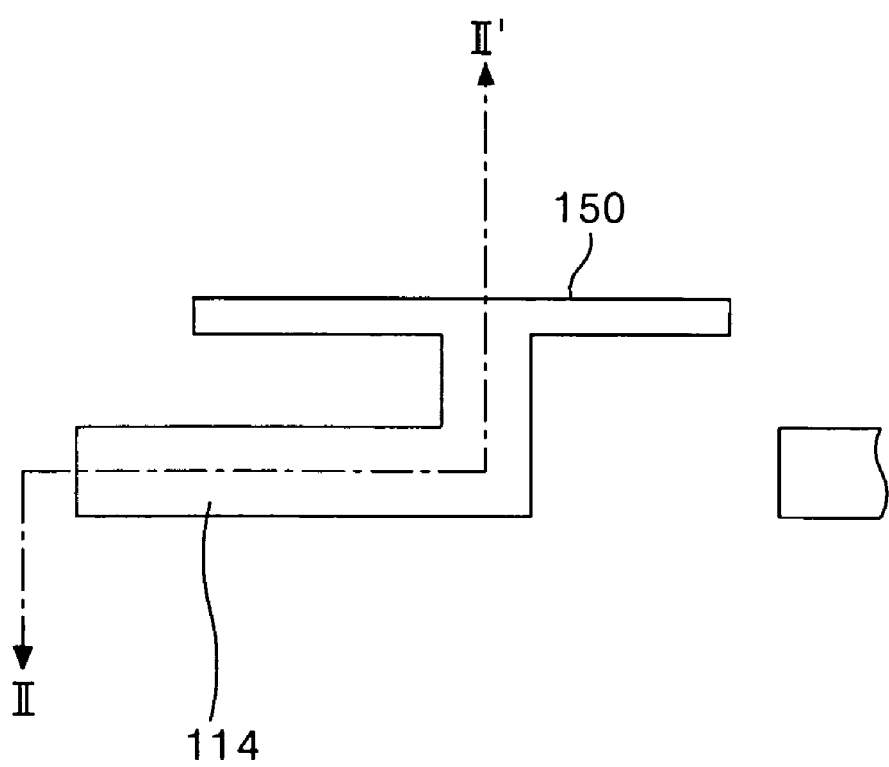
FIGS. 12A and 12B are a plane view and a sectional diagram for explaining a first mask process in a fabricating method of the thin film transistor substrate according to the second embodiment of the present invention.
Figure 12B:
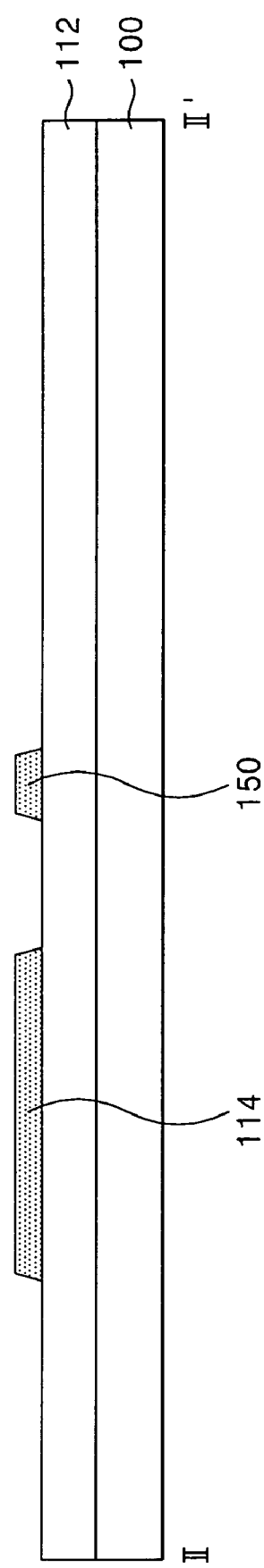

FIGS. 12A and 12B are a plane view and a sectional diagram for explaining a first mask process in the fabricating method of the poly-silicon TFT substrate according to the second embodiment of the present invention.

Referring to FIGS. 12A and 12B, the buffer film 112 is formed on the lower substrate 100, and the first and second integrated active layers 114, 150 are formed thereon by a first mask process.

The buffer film 112 is formed by depositing an inorganic insulating material such as $SiO_2$ on the entire surface of the lower substrate 100.

Then, the amorphous silicon thin film is formed on the buffer film 112 by a method such as LPCVD or PECVD, and then the amorphous silicon film is crystallized becoming a poly-silicon thin film. At this point, a de-hydrogenation process may be performed to remove hydrogen atoms present within the amorphous silicon thin film before crystallizing the amorphous silicon thin film. The crystallization method is a commonly used excimer laser annealing method. In the SLS method, a laser beam line is scanned in a horizontal direction to make a grain grow in the horizontal direction, thereby improving the size of the grain.

Then, the poly-silicon thin film is patterned by the photolithography process and the etching process using the first mask, thereby forming the integrated first and second active layers.

Figure 13A:
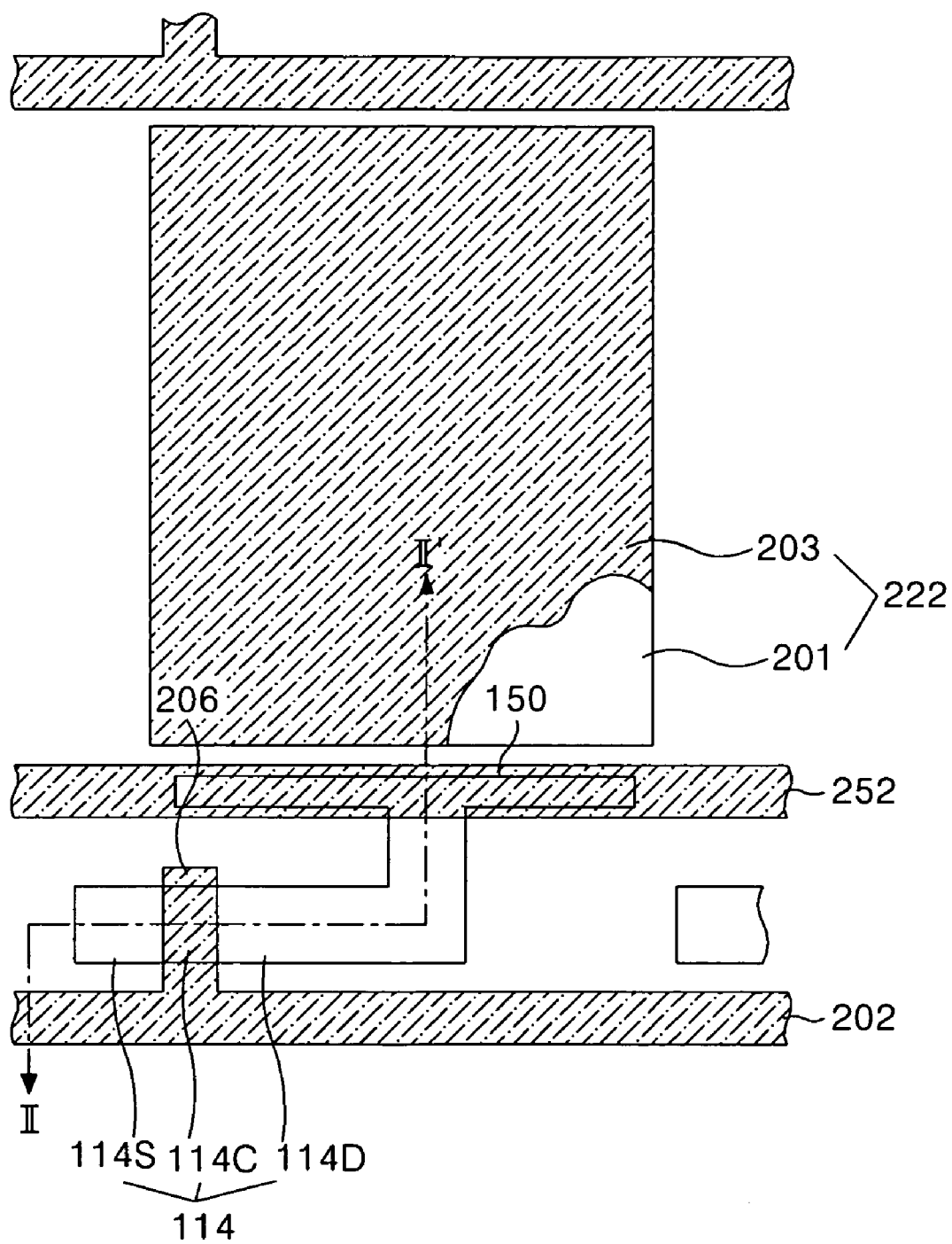
FIGS. 13A and 13B are a plane view and a sectional diagram for explaining a second mask process in a fabricating method of the thin film transistor substrate according to the second embodiment of the present invention.
Figure 13B:
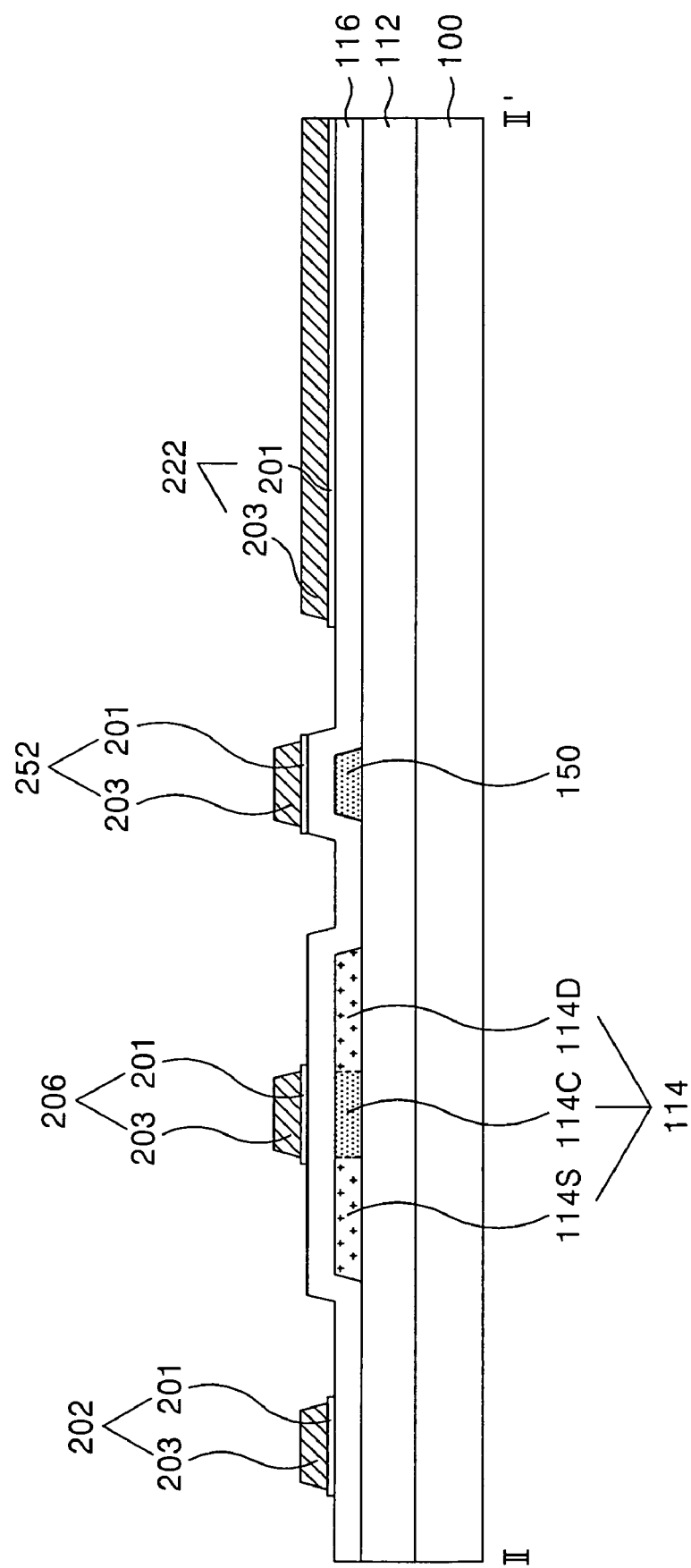

FIGS. 13A and 13B are a plan view and a sectional diagram for explaining a second mask process in the fabricating method of the poly-silicon TFT substrate according to the second embodiment of the present invention.

Referring to FIGS. 13A and 13B, the gate insulating film 116 is formed on the buffer film 112 where the first and second active layers 114, 150 are formed, and a pixel electrode 222 together with the gate line 202, the gate electrode 206 and the storage line 252 are formed thereon to have the double structure by a second mask process.

The gate insulating film 116 is formed by having the inorganic insulating material such as SiO$_2$ deposited on the entire surface of the buffer film 112 where the first and second active layers 114, 150 are formed.

Subsequently, the transparent conductive layer 201 and the metal layer 203 are deposited on the gate insulating film 116 using a sputtering method. The transparent conductive layer 201 may be formed of ITO (indium tin oxide), TO(tin oxide) or IZO (indium zinc oxide). The metal layer 203 is formed of Mo, Cu, Al, Ti, Cr, MoW or AlNd.

After the photo-resist pattern is formed on the metal layer 203 by the photolithography process using the second mask, the metal layer 203 is patterned by a first wet etching process and the transparent conductive layer 201 is patterned by a second wet etching process. Then, part of the photo-resist pattern is ashed so that the edge of the photo-resist pattern is located inside the edge of the patterned metal layer 203. Subsequently, both side portions of the metal layer 203 which are now exposed are etched by the dry etching process. Accordingly, the edge of the metal layer 203 is located inside the edge of the transparent conductive layer 201. The photo-resist pattern on the metal layer 203 is then removed by the stripping process.

Further, N+ impurities are injected into the first active layer 114 using the gate electrode as a mask to form the source area 114S and the drain area 114D of the first active layer 114. The source area 114S and the drain area 114D of the first active layer 114 are opposite to each other with the channel area 114C therebetween, wherein the channel area 114C overlaps the gate electrode 106.

Figure 14A:
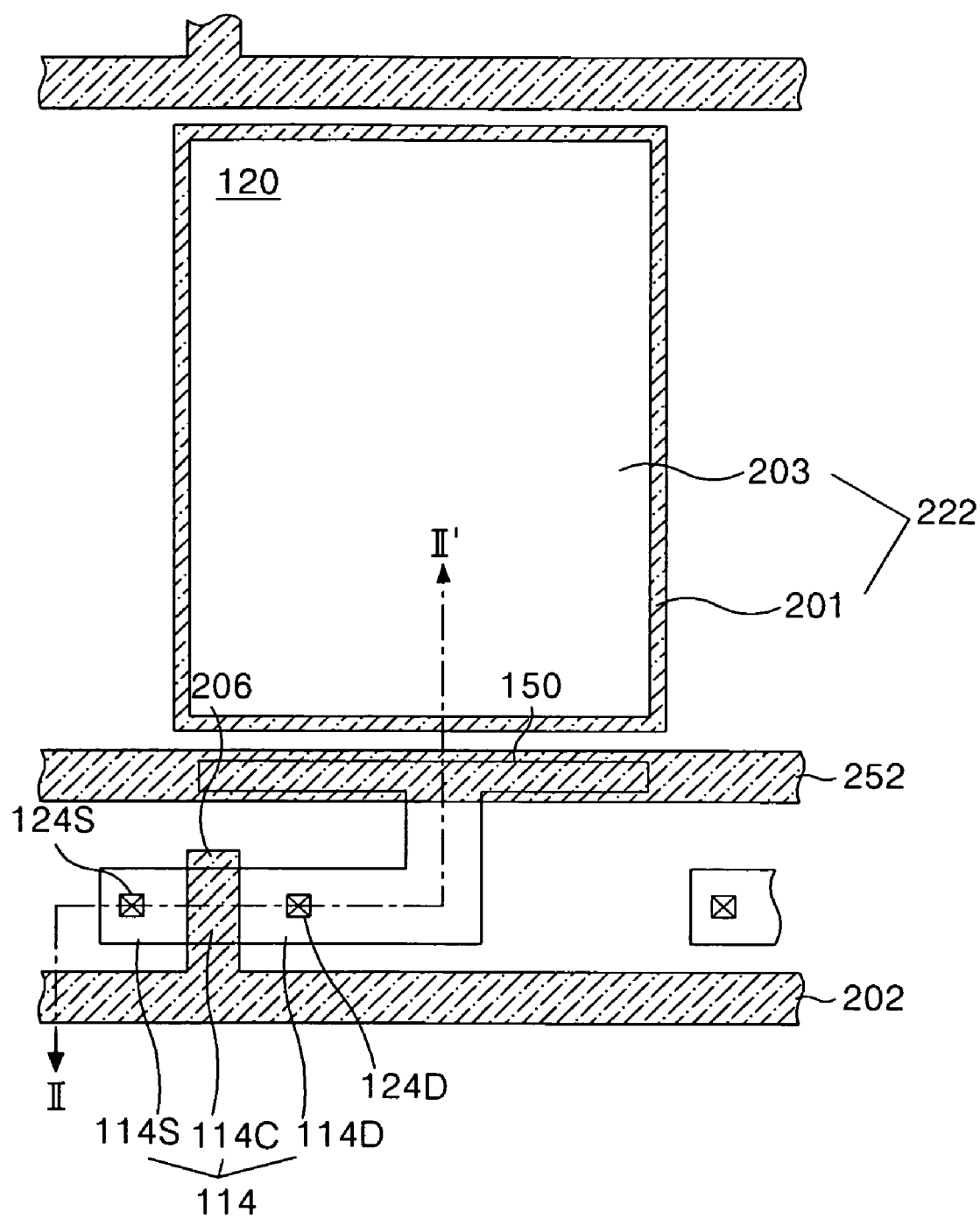
FIGS. 14A and 14B are a plane view and a sectional diagram for explaining a third mask process in a fabricating method of the thin film transistor substrate according to the second embodiment of the present invention.
Figure 14B:
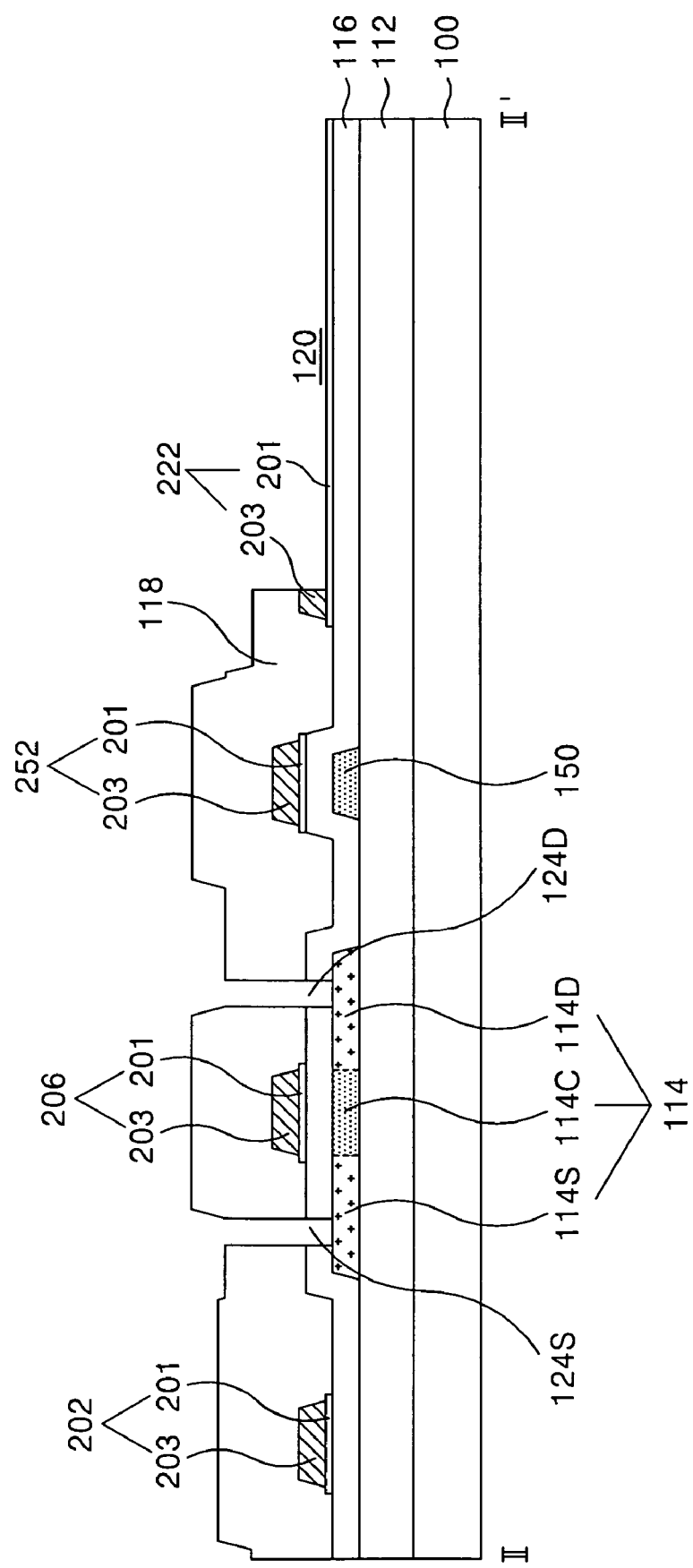

FIGS. 14A and 14B are a plane view and a sectional diagram for explaining a third mask process in the fabricating method of the poly-silicon TFT substrate according to the second embodiment of the present invention.

Referring to FIGS. 14A and 14B, the interlayer insulating film 118 having the source and drain contact holes 124S, 124D and the transmission hole 120 is formed by a third mask process on the gate insulating film 116 where the gate line 202, the gate electrode 206, the storage line 252, and the pixel electrode 222 are formed.

The interlayer insulating film 118 is formed by depositing an inorganic insulating material such as SiO$_2$ on the entire surface of the gate insulating film 118 where the gate line 202, the gate electrode 206, the storage line 252, and the pixel electrode 222 are formed.

Subsequently, the source and drain contact holes 124S, 124D are formed which respectively expose the source area 114S and the drain area 114D of the first active layer 114 by penetrating the interlayer insulating film 118 and the gate insulating film 116, and the transmission hole 120 is formed, which exposes the pixel electrode 222, using a photolithography process and an etching process using a third mask. Then, the metal layer 203 of the pixel electrode 222 exposed through the transmission hole 120 is etched to expose the transparent conductive layer 201.

Figure 15A:
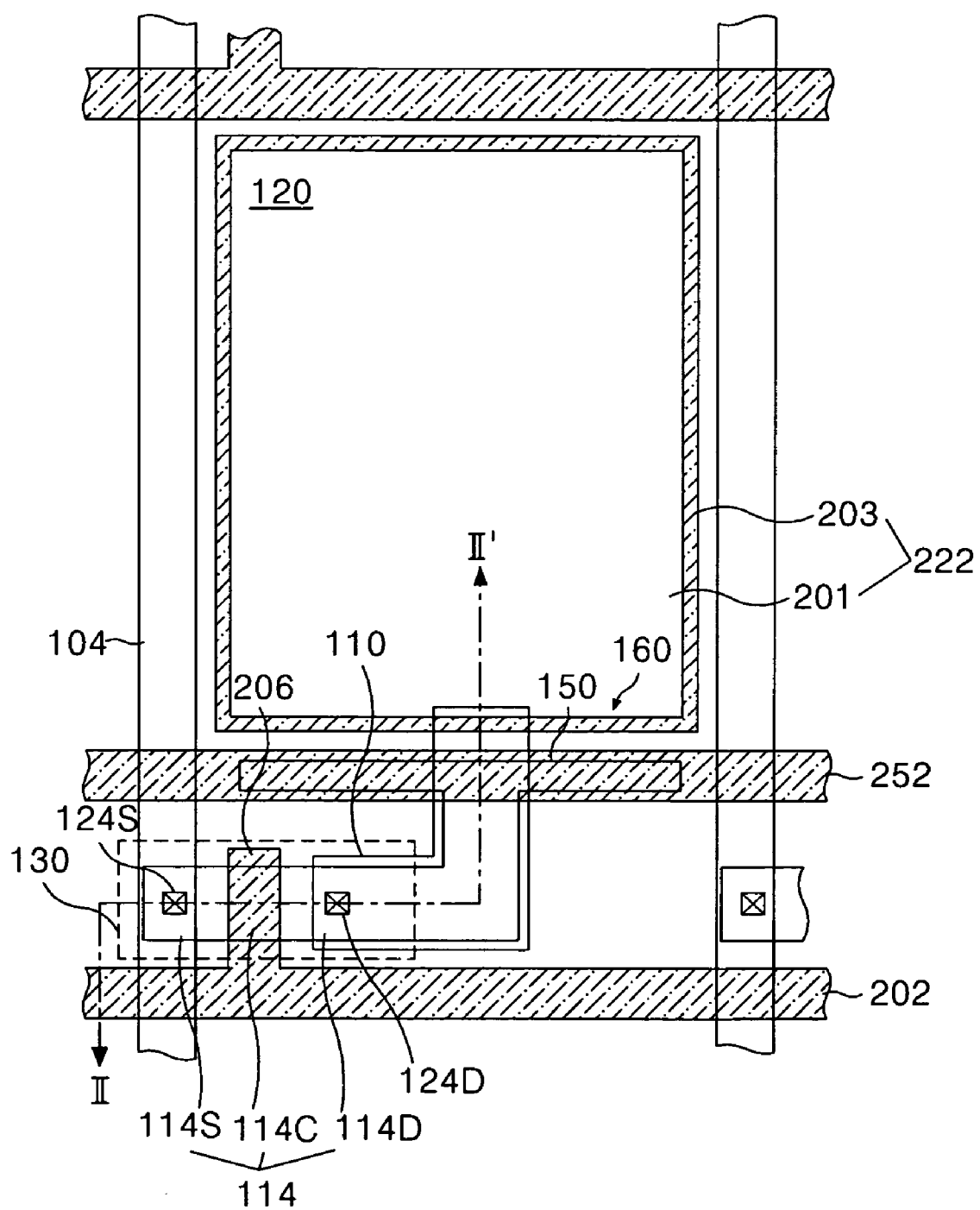
FIGS. 15A and 15B are a plane view and a sectional diagram for explaining a fourth mask process in a fabricating method of the thin film transistor substrate according to the second embodiment of the present invention.
Figure 15B:
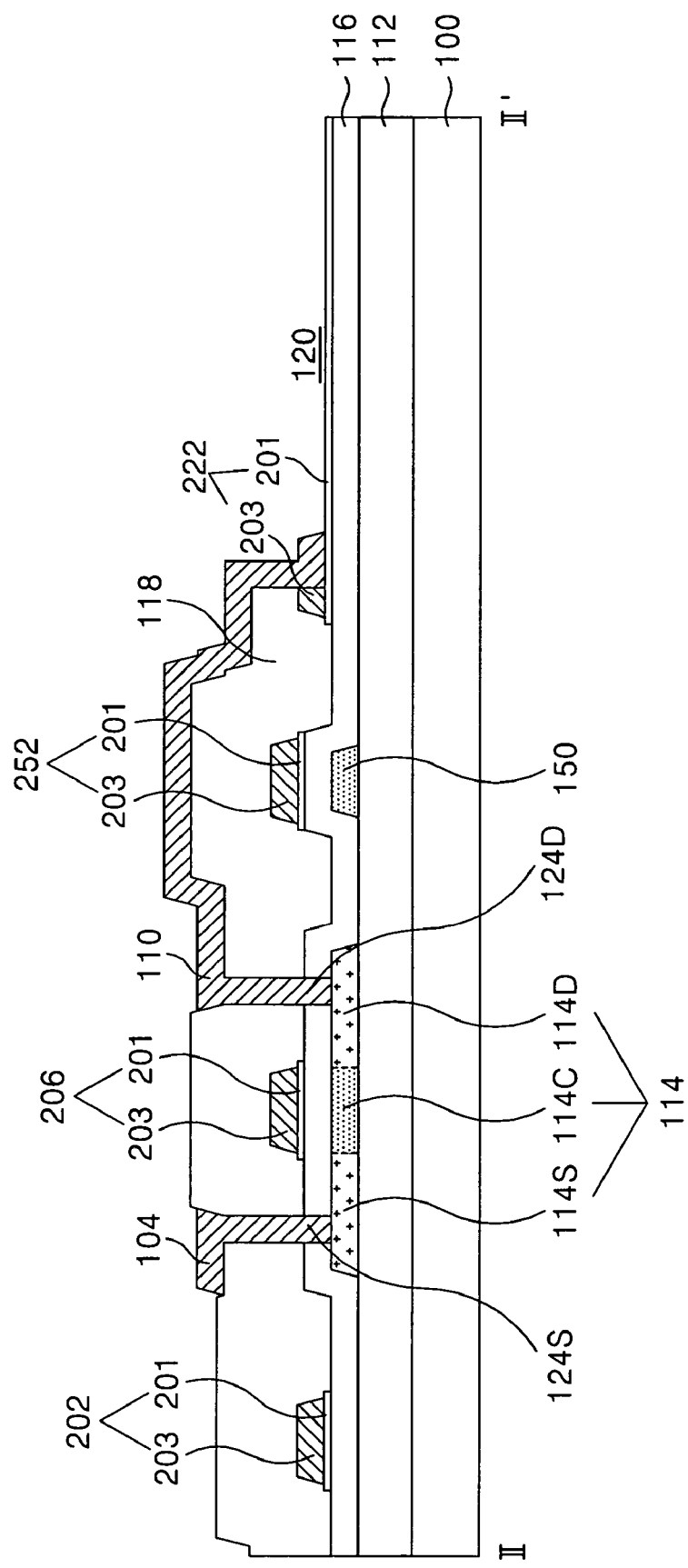

FIGS. 15A and 15B are a plane view and a sectional diagram for explaining a fourth mask process in the fabricating method of the poly-silicon type TFT substrate according to the second embodiment of the present invention.

Referring to FIGS. 15A and 15B, the drain electrode 110 and the data line 104 having the source electrode are formed on the interlayer insulating film 118 using a fourth mask process.

The data line 104 having the source electrode and the drain electrode 110 is formed by patterning the source/drain metal layer using a photolithography process and an etching process using a fourth mask after forming the source/drain metal layer on the interlayer insulating film 118. The data line 104 and the drain electrode 110 are respectively connected to the source area 114S and the drain area 114D of the first active layer 114 through the source and drain contact holes 124S, 124D. The drain electrode 110 extends to cross the storage line 152 so as to connect to the transparent conductive layer 201 and the metal layer 203 of the pixel electrode 222 which are exposed through the transmission hole 120.

The data line 104 and the drain electrode 110 can be made to be sufficiently protected by an alignment film of an organic insulating material which is formed to be the uppermost layer of the TFT substrate for liquid crystal alignment in the following process.

Figure 16:
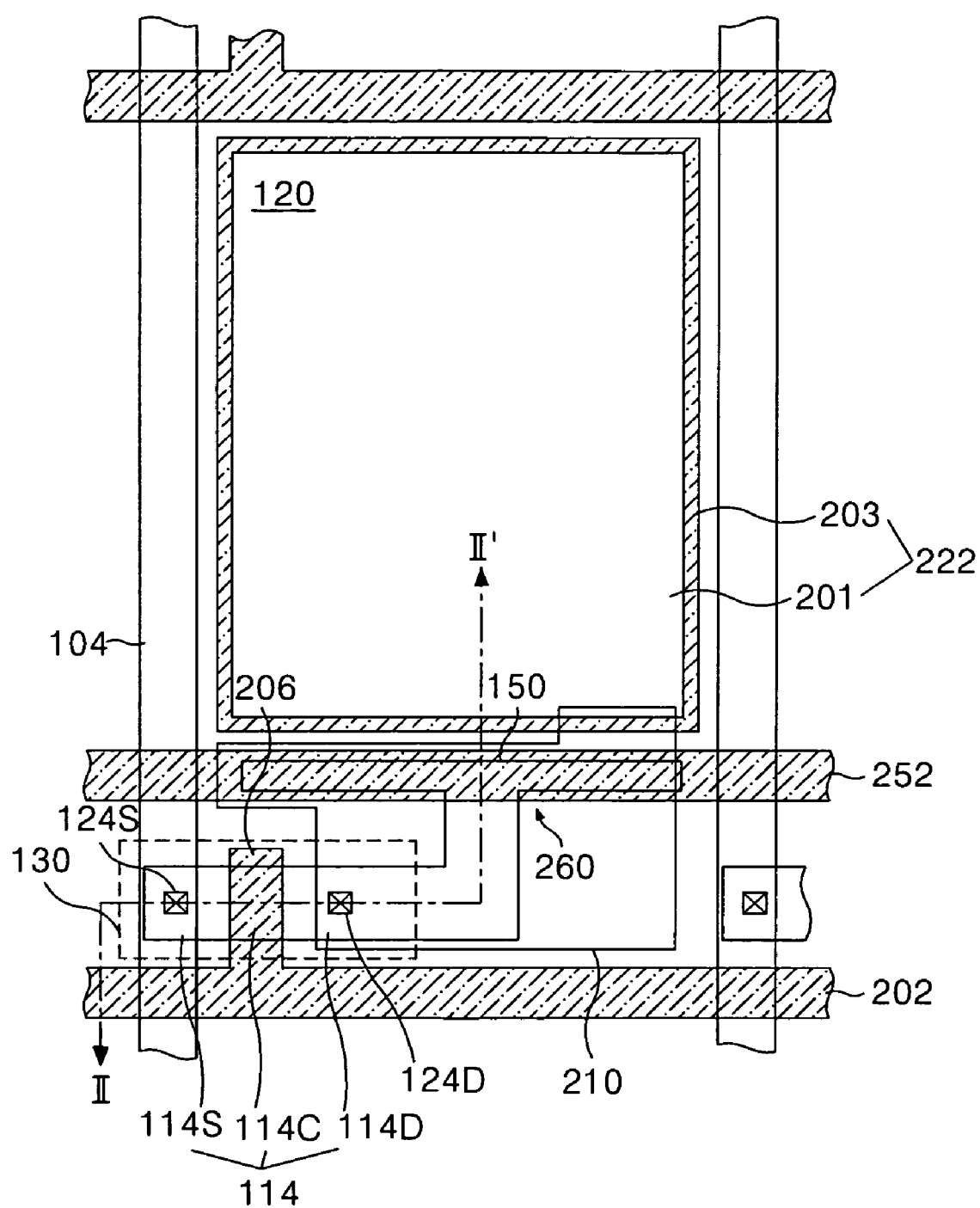
FIG. 16 is a plane view illustrating part of the thin film transistor substrate according to a third embodiment of the present invention.

FIG. 16 is a plane view illustrating part of a poly-silicon TFT substrate according to a third embodiment of the present invention.

The TFT substrate shown in FIG. 16 includes the same components as the TFT substrate shown in FIG. 10 except that the area of the drain electrode 210 is increased so as to increase the overlapping area of the storage line 252 and the drain electrode 210, thus the description for the repeated components will be omitted.

The drain electrode 210 covers the storage line 252 with the interlayer insulating film 118 therebetween and is connected to the pixel electrode 222 through the transmission hole 220. Specifically, an overlapping part of the drain electrode 210 and the storage line 252 is formed long along the storage line 252 to be adjacent to the data line 104 of both sides, and the drain electrode projects inward of the pixel electrode 222 from the overlapping part to be connected to the exposed pixel electrode 222 through the transmission hole. Accordingly, the overlapping area of the drain electrode 210 and the storage line 252 is increased, thereby increasing the capacity of the storage capacitor 260. Specifically, the storage capacitor 260 has a first storage capacitor and a second storage capacitor connected in parallel, wherein the first storage capacitor is formed by having the storage line 252 overlap the second active layer 150 with the gate insulating film 112 therebetween and the second storage capacitor is formed by having the storage line 252 overlap the drain electrode 210 with the interlayer insulating film 118 therebetween. Herein, due to the increase of the overlapping area of the storage line 252 and the drain electrode 210, the capacitance of the second storage capacitor is increased, thus the overall capacitance of the storage capacitor 260 being the sum of capacitance of the first and second storage capacitors increases.

As described above, the fabricating method of the poly-silicon TFT substrate according to the present invention forms the pixel electrode along with the gate line, the gate electrode, and the storage line which have the double layer structure, thereby simplifying the overall process to the four mask processes.

Further, the fabricating method of the poly-silicon TFT substrate according to the present invention etches the metal layer of the upper part once more using a dry etching method when patterning the transparent conductive layer and the metal layer of the double layer structure, thereby preventing the under-cut part of the transparent conductive layer. Accordingly, it is possible to prevent the TFT deterioration and the process defect caused by the under-cut part of the transparent conductive layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:

forming first and second conductive layers on a substrate;

forming a photo-resist pattern on the second conductive layer;

patterning the second conductive layer and the first conductive layer using the photo-resist pattern as a mask, wherein an edge of the patterned first conductive layer is located inside an edge of the patterned second conductive layer;

ashing the photo-resist pattern so as to reduce the photo-resist pattern remaining on the second conductive layer after patterning the second conductive layer and the first conductive layer;

etching at least one lateral part of the patterned second conductive layer using the ashed photo-resist pattern as a mask; and removing the remaining photo-resist pattern, wherein patterning the second conductive layer and the first conductive layer includes;

etching the second conductive layer using a first wet etching process; and etching the first conductive layer using a second wet etching process.

2. The method according to claim 1, wherein the at least one lateral part of the patterned second conductive layer is etched using a dry etching process.

3. The method according to claim 1, wherein etching the at least one lateral part of the patterned second conductive layer includes:

etching the at least one lateral part so that an edge of the patterned second conductive layer is located inside an edge of the patterned first conductive layer.

* * * * *